United States Patent [19]
Yamauchi et al.

[11] Patent Number: 5,477,196
[45] Date of Patent: Dec. 19, 1995

[54] PULSE GENERATOR

[75] Inventors: Shigenori Yamauchi, Kariya; Takamoto Watanabe, Nagoya, both of Japan

[73] Assignee: Nippondenso Co., Ltd., Kariya, Japan

[21] Appl. No.: 362,648

[22] Filed: Dec. 23, 1994

[30] Foreign Application Priority Data

Dec. 24, 1993 [JP] Japan ............... 5-327669

[51] Int. Cl.$^6$ .......... H03B 27/00; H03L 7/083; H03L 7/18; H03K 5/26
[52] U.S. Cl. .......... 331/60; 331/1 A; 331/25; 331/46; 331/57; 327/42; 327/158; 327/159
[58] Field of Search .......... 332/112, 144; 331/1 A, 25, 46, 48, 55, 56, 57, 58, 60; 329/307–309, 325; 327/42, 43, 107, 149, 150, 158, 159; 375/376; 455/260

[56] References Cited

U.S. PATENT DOCUMENTS

| | | | |
|---|---|---|---|
| 4,771,251 | 9/1988 | Allen et al. | 331/57 |
| 5,045,811 | 9/1991 | Lewis | 331/1 A |
| 5,126,691 | 6/1992 | Mijuskovic | 331/1 A |
| 5,128,624 | 7/1992 | Hoshino et al. | 328/133 |
| 5,134,371 | 7/1992 | Watanabe et al. | 324/252 |
| 5,225,795 | 7/1993 | Iinuma | 332/144 X |
| 5,289,135 | 2/1994 | Hoshino et al. | 377/43 X |
| 5,331,294 | 7/1994 | Watanabe et al. | 331/57 |
| 5,416,444 | 5/1995 | Yamauchi et al. | 331/45 |

FOREIGN PATENT DOCUMENTS 516379  12/1992  European Pat. Off. .
4400825  1/1993  Germany .

Primary Examiner—David Mis
Attorney, Agent, or Firm—Cushman, Darby & Cushman

[57] ABSTRACT

In a device for encoding a pulse phase difference or controlling an oscillation frequency based on delayed signals sequentially output by a delay circuit, the encoding of a pulse phase difference or the oscillation control can be simultaneously performed using a single delay device. There is provided a frequency converter including a ring oscillator consisting of inverting circuits interconnected in the form of a ring, a pulse phase difference encoding circuit for encoding the cycle of a reference signal into a binary digital value based on a pulse output by the ring oscillator, an arithmetic circuit for multiplying or dividing the binary digital value by a predetermined value to generate control data and a digitally controlled oscillation circuit for generating a pulse signal in a cycle in accordance with the control data based on the pulse output by the ring oscillator, the ring oscillator being shared by the encoding circuit and oscillation circuit. This makes the time resolution of the encoding and oscillation circuits constant, thereby allowing accurate frequency conversion.

17 Claims, 10 Drawing Sheets

1

PULSE GENERATOR

CROSS REFERENCE TO RELATED APPLICATION

This application is based upon and claims the benefit of priority of Japanese Patent Application No. 5-327669 filed on Dec. 24, 1993, the contents of which are incorporated herein by reference.

BACKGROUND OF THE INVENTION

1. Field of the Invention

The present invention relates to a pulse phase difference encoding device, an oscillation device and a combination thereof wherein a delay circuit consisting of a plurality of interconnected delay elements is provided to perform the encoding of a phase difference in a pulse signal, the outputting of an oscillation signal according to digital data or both of them concurrently based on delayed signals sequentially output at predetermined connecting points of the delay elements.

2. Related Arts

As pulse phase difference encoding devices for encoding a phase difference in a pulse signal into digital data, pulse phase difference encoding devices such as that disclosed in Japanese unexamined patent publication No. H3-220814 are known wherein a delay circuit consisting of a plurality of interconnected delay elements is provided; the first pulse signal is input to the delay element at the first stage of the delay circuit; the delay element in the delay circuit at which the input pulse has arrived at the point in time at which the next pulse is input is detected; the number of the delay elements connected up to this element from that at the first stage is encoded to obtain digital data corresponding to the phase difference between those pulse signals.

Further, as oscillation devices whose oscillation frequencies can be digitally controlled over wide ranges from several hundred KHz to several tens MHz, digitally controlled oscillation devices such as that disclosed in Japanese unexamined patent publication No. H5-102801 have been proposed, wherein a delay circuit consisting of a plurality of interconnected delay elements is provided as in the pulse phase difference encoding devices as described above and wherein the delaying operation of the delay circuit is started by inputting a pulse signal to the delay element at the first stage of the delay circuit and, thereafter, an oscillation signal is output in a cycle according to digital data by repeating the execution of operations such as outputting an oscillation signal when pulse signals are output from the delay elements at connecting positions corresponding to digital data in the delay circuit and initializing the delay circuit concurrently.

With those devices, the detection of pulse phase differences and the control over an oscillation frequency can be performed at time resolution which is determined by the delay time of the delay elements of the delay circuits. It is therefore possible to achieve a significant improvement over the conventional devices with respect to the accuracy of the detection of pulse phase differences and the accuracy of the control over an oscillation frequency.

Further, since these devices can accurately perform the detection of pulse phase differences and the control over an oscillation frequency, it is possible to provide a PLL (phase locked loop) for communication apparatuses, motor controlling apparatuses, etc. which can be digitally controlled and which is highly accurate by combining a pulse phase difference encoding device and a digitally controlled oscillation device, for example, as disclosed in Japanese unexamined patent publication No. H5-102801. Alternatively, the ratio of the cycle of an oscillation signal to be measured to that of a reference signal, i.e., the oscillation frequency of the oscillation signal can be detected, for example, in a manner utilizing two pulse phase difference encoding devices simultaneously wherein the cycle of the reference oscillation signal input to one of the pulse phase difference encoding device is encoded; the cycle of the oscillation signal input to the other pulse phase difference encoding device is encoded; and division is carried out on the encoded data to obtain the above-mentioned ratio. Further, it is also possible to use two digitally controlled oscillation devices concurrently and to synthesize the oscillation signals of those oscillation devices to generate an oscillation signal having a frequency higher than the frequencies which can be obtained by those oscillation devices.

Such concurrent use of the devices as described above will provide a successful result if the delay circuits incorporated in those devices operate at completely the same time resolution. However, variations in the time resolution among the delay circuits in those devices caused by variations in the delay elements of the delay circuits will result in variations in time resolution among the oscillation signals of the devices which are in accordance with the encoded data of pulse phase differences and digital data. This has resulted in problems such as that the operation of a PLL can not be digitally controlled with high accuracy if the PLL is constituted by a pulse phase difference encoding device and a digitally controlled oscillation device as described above.

Such a problem can be avoided by sharing a single delay circuit among those devices instead of providing each of those devices with a delay circuit. In conventional devices, however, since a delay circuit is initialized and is activated for a delaying operation when the first pulse signal to be phase-difference-encoded is input from the outside or when an oscillation signal is output, it has not been possible to share a single delay circuit among such devices.

SUMMARY OF THE INVENTION

The present invention confronts such problems, and it is an object of the present invention to provide a device for encoding pulse phase differences and controlling oscillation frequencies based on delayed signals sequentially output from a delay circuit constituted by connecting a plurality of delay elements which is capable of concurrently performing such pulse phase difference encoding and oscillation control operations using a single delay device.

According to a first aspect of the present invention, there is provided a pulse generator for generating a pulse based on a first pulse train including first piece of information representing a phase difference or digital value and for generating a pulse based on a second pulse train including second piece of information representing a phase difference or digital value comprising:

a delay circuit which is constituted by a plurality of interconnected delay elements, to which an input signal is input at any connecting point of the delay element and which sequentially outputs a plurality of delayed signals obtained by delaying the input signal by delay periods determined by the numbers of the delay elements connected from a plurality of predetermined connecting points of the delay elements;

a first pulse output circuit to which the first pulse train is input, which outputs first position data representing the connecting position of particular one of the delay element of the delay circuit from the first piece of information in the first pulse train and which generates a first output pulse in accordance with the first position data; and a second pulse output circuit to which the second pulse train is input, which outputs second position data representing the connecting position of particular one of the delay element of the delay circuit from the second piece of information in the second pulse train and which generates a second output pulse in accordance with the second position data, the first and second pulse output circuits sharing the delay circuit in generating the respective pulses.

According to a second aspect of the present invention, there is provided the pulse generator according to the first aspect, wherein:

the first piece of information in the first pulse train is a first phase difference between a pulse at a particular point in time and a pulse at another point in time in the first pulse train;

the first pulse output circuit is constituted by a digital data encoding circuit to which the first pulse train is input, which generates first position data representing the connecting position of the delay element which issued the delayed signal when the pulse at the particular point in time in the first pulse train was input and the delay element which issued the delayed signal when the pulse at above-described another point in time was input and which generates first digital data constituted by a pulse indicating the first phase difference in the first pulse train from the difference between the two connecting positions in the position data;

the second pulse train is any one of the first digital data output by an arithmetic circuit in the first digital data encoding circuit, the first digital data multiplied by a predetermined value, and the first digital data divided by a predetermined value; and the second pulse output circuit is constituted by a pulse train output circuit to which the second pulse train is input, which detects the second position data from the second pulse train and which sequentially outputs a pulse when the delay element at the connecting position corresponding to the second position data issues the delayed signal among the delayed signals sequentially output by the delay circuit.

According to a third aspect of the present invention, there is provided the pulse generator according to the first aspect, wherein:

the first piece of information in the first pulse train is a first phase difference between a pulse at a particular point in time and a pulse at another point in time in the first pulse train;

the first pulse output circuit is constituted by a digital data encoding circuit to which the first pulse train is input, which encodes the first phase difference in the first pulse train into first digital data and which outputs the first digital data as the first output pulse, the digital data encoding circuit comprising a connecting position data generation circuit which detects the latest delayed signal output by the delay circuit when the pulse at the particular point in time in the first pulse train is input, generates first connecting position data representing the connecting position of the delay element which issued the latest delayed signal in response to the input of the pulse at the particular point in time within the delay circuit, detects the latest delayed signal output by the delay circuit when the pulse at above-described another point in time in the first pulse train is input and generates second connecting position data representing the connecting position of the delay element which issued the latest delayed signal in response to the input of the pulse at above-described another point in time within the delay circuit and an arithmetic circuit which calculates the positional difference between the first connecting position data and the second connecting position data generated by the connecting position data generating circuit and outputs the calculated positional difference as the first digital data representing the first phase difference in the first pulse train, the first position data comprising the first connecting position data and the second connecting position data;

the second pulse train is any one of the first digital data output by the arithmetic circuit in the first digital data encoding circuit, the first digital data multiplied by a predetermined value, and the first digital data divided by a predetermined value; and the second pulse output circuit is constituted by a digitally controlled pulse generation circuit to which the second pulse train is input and which outputs a pulse at an interval corresponding to the second pulse train as the second output pulse, the digitally controlled pulse generation circuit comprising a signal selection circuit which detects the second position data from the second pulse train and selects a second delayed signal output by the delay element at the connecting position corresponding to the second position data from among the delayed signals sequentially output by the delay circuit and a pulse train output circuit which sequentially outputs a pulse when the second delayed signal is selected by the signal selection circuit.

According to a fourth aspect of the present invention, there is provided the pulse generator according to the second aspect, wherein the delay circuit is constituted by a pulse circulating circuit which includes a first delay element connected in the first position and a last delay element connected in the last position, in which the last delay element is connected to the first delay element and which circulates the input signal through the plurality of interconnected delay elements; the output of the delayed signals is started in response to the input of an input signal at any connecting point of the delay elements; and the plurality of delayed signals are the result of delaying the input signal by delay periods determined by the numbers of the delay elements interconnected.

According to a fifth aspect of the present invention, there is provided the pulse generator according to fourth aspect, wherein the connecting position data generation circuit comprises a first counting circuit which counts the number of the circulations of the input signal within the pulse circulating circuit and outputs a first count value and a data combining circuit which combines the first count value with the first and second connecting position data generated by the connecting position data generation circuit in the digital data encoding circuit and outputs the first and second connecting position data after such combination and wherein first and second connecting position data after the combination as the first and second connecting position data input to the arithmetic circuit.

According to a sixth aspect of the present invention, there is provided the pulse generator according to the third aspect, wherein the signal selection circuit in the digitally controlled pulse generation circuit comprises a second counting circuit which counts the number of the circulations of the pulse signal within the pulse circulating circuit and outputs a detection signal indicating when the count value reaches a value corresponding to the count value of the circulations to be made in the second pulse train and a counting control circuit which initializes the count value in the second counting circuit to resume the counting operation when the detection signal is output by the second counting circuit.

According to a seventh aspect of the present invention, there is provided the pulse generator according to the third aspect, wherein the signal selection circuit in the digitally controlled pulse generation circuit comprises a position data output portion to which the second pulse train is input, initially outputs the second pulse train as the second position data, updates the previously output second position data by adding the currently input second pulse train thereto and outputs the result as updated second position data and a delayed signal selecting portion which selects the second delayed signal output by the delay element at the connecting position corresponding to the second position data from among the delayed signals sequentially output by the delay circuit.

According to an eighth aspect of the present invention, there is provided the pulse generator according to the first aspect, wherein:

the first pulse train has a first phase difference between a pulse at a particular point in time and a pulse at another point in time, the first piece of information in the first pulse train being the first phase difference, and the second pulse train has a second phase difference between a pulse at a particular point in time and a pulse at another point in time, the second piece of information in the second pulse train being the second phase difference;

the first pulse output circuit is constituted by a first digital data encoding circuit to which the first pulse train is input, which generates first position data representing the connecting position of the delay element which issued the delayed signal when the pulse at the particular point in time in the first pulse train was input and the delay element which issued the delayed signal when the pulse at above-described another point in time was input and which generates first digital data constituted by a pulse indicating the first phase difference in the first pulse train from the difference between the two connecting positions in the position data; and the second pulse output circuit is constituted by a second digital data encoding circuit to which the second pulse train is input, which generates second position data representing the connecting position of the delay element which issued the delayed signal when the pulse at the particular point in time in the second pulse train was input and the delay element which issued the delayed signal when the pulse at above-described another point in time was input and which generates second digital data constituted by a pulse indicating the second phase difference in the second pulse train from the difference between the two connecting positions in the position data.

According to a ninth aspect of the present invention, there is provided the pulse generator according to the first aspect, wherein:

the first pulse train has a first phase difference between a pulse at a particular point in time and a pulse at another point in time, the first piece of information in the first pulse train being the first phase difference, and the second pulse train has a second phase difference between a pulse at a particular point in time and a pulse at another point in time, the second piece of information in the second pulse train being the second phase difference;

the first pulse output circuit is constituted by a first digital data encoding circuit to which the first pulse train is input, which encodes the first phase difference in the first pulse train into first digital data and which outputs the first digital data as the first output pulse, the first digital data encoding circuit comprising a first connecting position data generation circuit which detects the latest delayed signal output by the delay circuit when the pulse at the particular point in time in the first pulse train is input, generates first connecting position data representing the connecting position of the delay element which issued the latest delayed signal in response to the input of the pulse at the particular point in time within the delay circuit, detects the latest delayed signal output by the delay circuit when the pulse at above-described another point in time in the first pulse train is input and generates second connecting position data representing the connecting position of the delay element which issued the latest delayed signal in response to the input of the pulse at above-described another point in time within the delay circuit and a first arithmetic circuit which calculates the positional difference between the first connecting position data and the second connecting position data generated by the first connecting position data generating circuit and outputs the calculated positional difference as the first digital data representing the first phase difference in the first pulse train, the first position data comprising the first connecting position data and the second connecting position data;

the second pulse output circuit is constituted by a second digital data encoding circuit to which the second pulse train is input, which encodes the second phase difference in the second pulse train into second digital data and which outputs the second digital data as the second output pulse, the second digital data encoding circuit comprising a second connecting position data generation circuit which detects the latest delayed signal output by the delay circuit when the pulse at the particular point in time in the second pulse train is input, generates third connecting position data representing the connecting position of the delay element which issued the latest delayed signal in response to the input of the pulse at the particular point in time within the delay circuit, detects the latest delayed signal output by the delay circuit when the pulse at above-described another point in time in the second pulse train is input and generates fourth connecting position data representing the connecting position of the delay element which issued the latest delayed signal in response to the input of the pulse at above-described another point in time within the delay circuit and a second arithmetic circuit which calculates the positional difference between the third connecting position data and the fourth connecting position data generated by the second connecting position data generating circuit and outputs the calculated positional difference as the second digital data representing the second phase difference in the second pulse train, the second position data comprising the third connecting position data and the fourth connecting position data;

the second pulse train is any one of the first digital data output by the arithmetic circuit in the first digital data encoding circuit, the first digital data multiplied by a predetermined value, and the first digital data divided by a predetermined value; and the second pulse output circuit is constituted by a digitally controlled pulse generation circuit to which the second pulse train is input and which outputs a pulse at an interval corresponding to the second pulse train as the second output pulse, the digitally controlled pulse generation circuit comprising a signal selection circuit which detects the second position data from the second pulse train and selects a second delayed signal output by the delay element at the connecting position corresponding to the second position data among the delayed signals sequentially output by the delay circuit and a pulse train output circuit which sequentially outputs a pulse when the second delayed signal is selected by the signal selection circuit.

According to a tenth aspect of the present invention, there is provided the pulse generator according to the eighth aspect, wherein the delay circuit is constituted by a pulse circulating circuit which includes a first delay element connected in the first position and a last delay element connected in the last position, in which the last delay element is connected to the first delay element and which circulates the input signal through the plurality of interconnected delay elements; the output of the delayed signals is started in response to the input of an input signal at any connecting point of the delay elements; and the plurality of delayed signals are the result of delaying the input signal by delay periods determined by the numbers of the delay elements interconnected.

According to an eleventh aspect of the present invention, there is provided the pulse generator according to the ninth aspect, wherein:

the first connecting position data generation circuit comprises a first counting circuit which counts the number of the circulations of the input signal within the pulse circulating circuit and outputs a first count value and a first data combining circuit which combines the first count value with the first and second connecting position data generated by the first connecting position data generation circuit in the first digital data encoding circuit and outputs the results;

the second connecting position data generation circuit comprises a second counting circuit which counts the number of the circulations of the input signal within the pulse circulating circuit and outputs a second count value and a second data combining circuit which combines the second count value with the third and fourth connecting position data generated by the second connecting position data generation circuit in the second digital data encoding circuit and outputs the results; and the combined data is output as the third and fourth connecting position data input to the second arithmetic circuit.

According to a twelfth aspect of the present invention, there is provided the pulse generator according to the eighth aspect, comprising a dividing circuit for calculating the ratio between the first digital data from the first digital data encoding circuit and the second digital data from the second digital data encoding circuit.

According to a thirteenth aspect of the present invention, there is provided the pulse generator according to the first aspect, wherein:

the first pulse train is first digital data including the first piece of information, and the second pulse train is second digital data including the second piece of information;

the first pulse output circuit is constituted by a first digitally controlled pulse generation circuit to which the first pulse train is input, which detects the first position data from the first pulse train and which sequentially generates a pulse when the delay element at the connecting position corresponding to the first position data issues the delayed signal among the delayed signals sequentially output by the delay circuit; and the second pulse output circuit is constituted by a second digitally controlled pulse generation circuit to which the second pulse train is input, which detects the second position data from the second pulse train and which sequentially generates a pulse when the delay element at the connecting position corresponding to the second position data issues the delayed signal among the delayed signals sequentially output by the delay circuit.

According to a fourteenth aspect of the present invention, there is provided the pulse generator according to the first aspect, wherein:

the first pulse train is first digital data including the first piece of information, and the second pulse train is second digital data including the second piece of information;

the first pulse output circuit is constituted by a first digitally controlled pulse generation circuit which outputs a pulse at an interval corresponding to the first piece of information in the first digital data as the first output pulse, the first digitally controlled pulse generation circuit comprising a first signal selection circuit to which the first digital data is input, which detects the first position data from the first digital data and which selects a first delayed signal output by the delay element at the connecting position corresponding to the first position data from among the delayed signals sequentially output by the delay circuit and a first pulse train output circuit which sequentially outputs a pulse when the first delayed signal is selected by the first signal selection circuit; and the second pulse output circuit is constituted by a second digitally controlled pulse generation circuit which outputs a pulse at an interval corresponding to the second piece of information in the second digital data as the second output pulse, the second digitally controlled pulse generation circuit comprising a second signal selection circuit to which the second digital data is input, which detects the second position data from the second digital data and which selects a second delayed signal output by the delay element at the connecting position corresponding to the second position data from among the delayed signals sequentially output by the delay circuit and a second pulse train output circuit which sequentially outputs a pulse when the second delayed signal is selected by the second signal selection circuit.

According to a fifteenth aspect of the present invention, there is provided the pulse generator according to the thirteenth aspect, wherein the delay circuit is constituted by a pulse circulating circuit which includes a first delay element connected in the first position and a last delay element connected in the last position, in which the last delay element is connected to the first delay element and which circulates the input signal through the plurality of interconnected delay elements; the output of the delayed signals is started in response to the input of an input signal at any connecting point of the delay elements; and the plurality of delayed signals are the result of delaying the input signal by delay periods determined by the numbers of the delay elements interconnected.

According to a sixteenth aspect of the present invention, there is provided the pulse generator according to the fourteenth aspect, wherein:

the first signal selection circuit in the first digitally controlled pulse generation circuit comprises a first counting circuit which counts the number of the circulations of the pulse signal within the pulse circulating circuit and outputs a detection signal indicating when the count value reaches a value corresponding to the count value of the circulations to be made in the first digital data and a first counting control circuit which initializes the count value in the first counting circuit to resume the counting operation when the detection signal is output by the first counting circuit; and the second signal selection circuit in the second digitally controlled pulse generation circuit comprises a second counting circuit which counts the number of the circulations of the pulse signal within the pulse circulating circuit and outputs a detection signal indicating when the count value reaches a value corresponding to the count value of the circulations to be made in the second digital data and a second counting control circuit which initializes the count value in the second counting circuit to resume the counting operation when the detection signal is output by the second counting circuit.

According to a seventeenth aspect of the present invention, there is provided the pulse generator according to the thirteenth aspect, wherein:

the first signal selection circuit comprises a first position data output portion to which the first digital data is input, initially outputs the first digital data as the first position data, updates the previously output first position data by adding the currently input first digital data thereto and outputs the result as updated first position data and a first delayed signal selecting portion which selects the first delayed signal output by the delay element at the connecting position corresponding to the first position data from among the delayed signals sequentially output by the delay circuit; and the second signal selection circuit comprises a second position data output portion to which the second digital data is input, initially outputs the second digital data as the second position data, updates the previously output second position data by adding the currently input second digital data thereto and outputs the result as updated second position data and a second delayed signal selecting portion which selects the second delayed signal output by the delay element at the connecting position corresponding to the second position data from among the delayed signals sequentially output by the delay circuit.

With pulse phase difference encoding devices configured using pulse generators having the above-described configuration, the sharing of a delay circuit among a plurality of pulse phase difference encoding devices can be realized. In each of the pulse phase difference encoding devices, each time an external pulse signal is input, the latest delayed signal output by the delay circuit is detected; digital data indicating the connecting position of the delay element which has output the delayed signal in the delay circuit are generated; the deviation between the previously generated digital data and the latest digital data is calculated; and the result of the calculation is output as digital data indicating the phase difference between the pulse signals.

Specifically, a pulse phase difference encoding circuit according to the present invention is configured to encode the position in a delay circuit at which a delayed signal is output each time an external pulse signal is input, to calculate the deviation between the encoded value and the previous encoded value and to output the result of the calculation as digital data indicating the difference between the phases of the two pulse signals input from the outside. This makes it possible to encode the phase difference between two pulse signals using only delayed signals sequentially and successively output from a delay circuit without activating the delay circuit by the first input pulse signal as in conventional pulse phase difference encoding circuits. Thus, a delay circuit is shared among a plurality of pulse phase difference encoding circuits.

As a result, in a pulse phase difference encoding device employing the present invention, a single delay circuit can be shared among a plurality of pulse phase difference encoding circuits to concurrently encode phase differences between a plurality of pulse signals. This makes it possible to provide a simpler circuit configuration and to make a device more compact when compared to combinations of conventional pulse phase difference encoding circuits because the delay circuit is shared by the pulse phase difference encoding circuits. In addition, it is possible to achieve matching of the time resolution of digital data encoded by those pulse phase difference encoding circuits.

Further, in the pulse phase difference encoding device, the above-described delay circuit may be constituted by a pulse circulating circuit including a plurality of inverting circuits which are interconnected in the form of a ring and which sequentially invert pulse signals to circulate them. The number of the circulations of a pulse signal within the pulse circulating circuit may be counted in the pulse phase difference encoding circuit, and the count value may be used as high order bit data among the digital data generated.

When a phase difference between pulse signals is encoded, if the delay circuit used is constituted by simply connecting delay elements, the number of the delay elements constituting the delay circuit must be increased as the phase difference to be encoded increases. Further, when phase differences between pulse signals which are successively input are to be sequentially encoded, the number of the delay elements constituting the delay circuit must be infinite. Therefore, the delay circuit is constituted by a pulse circulating circuit consisting of a plurality of inverting circuits interconnected in the form of a ring. This arrangement makes it possible to encode even a phase difference between pulse signals which is larger than the time required for the pulse signals to make one circulation in the pulse circulating circuit without any problem because even if the number of the inverting circuits constituting the pulse circulating circuit is reduced, delayed signals are sequentially and continuously output from the pulse circulating circuit; the number of the circulations a pulse signal makes within the pulse circulating circuit is counted; and the deviation is calculated using the count value as high order bit data among the digital data.

As a result, even if the number of the delay elements (inverting elements) constituting the delay circuit (pulse circulating circuit) is small, phase differences between pulse signals can be continuously encoded over a wide range. This makes it possible to provide a device having a simple configuration and hence a compact size.

In an oscillation device employing the present invention, a delay circuit is shared among a plurality of digitally controlled oscillation circuits. In each of the digitally controlled oscillation circuits, when digital data indicating the output cycle of a pulse signal is input, an input data outputting means first outputs predetermined input data to a signal selection means. Then, the signal selection means selects the delayed signal output by the delay element at the connecting position corresponding to the input data from among delayed signals sequentially output by the delay circuit. When the signal selection means selects the delayed signal, a pulse signal outputting means outputs a pulse signal. Further, when the signal selection means selects the delayed signal output by the delay circuit, the input data outputting means updates the input data being output to the signal selection means by adding digital data being input from the outside thereto. As a result, the signal selection means selects again a delayed signal output by the delay circuit after a period of time corresponding to this digital data. When the signal selection means selects this delayed signal, the pulse signal outputting means generates a pulse signal again.

In other words, according to the present invention, the digitally controlled oscillation circuits are configured so that each time the signal selection means selects a delayed signal (i.e., each time the pulse signal outputting means outputs a pulse signal), the input data used by the signal selection means to select the delayed signal is updated by adding digital data input from the outside. This makes it possible to control the output cycle (i.e., oscillation frequency) of a pulse signal using delayed signals which are sequentially and continuously output by the delay circuit without initializing and activating the delay circuit each time a pulse signal serving as an oscillation signal is output. Thus, the sharing of a delay circuit among a plurality of digitally controlled oscillation circuits is realized.

As a result, in an oscillation device employing the present invention, a single delay circuit can be shared among a plurality of digitally controlled oscillation circuits to output pulse signals having predetermined cycles corresponding to a plurality of digital data input from the outside This makes it possible to provide a simpler circuit configuration and to make a device more compact when compared to combinations of conventional digitally controlled oscillation circuits because the delay circuit is shared by the digitally controlled oscillation circuits. In addition, it is possible to achieve matching of the time resolution of the pulse signal generated by each of the digitally controlled oscillation circuits to the digital data.

In this oscillation circuit, the above-described delay circuit can also be constituted by a pulse circulating circuit which includes a plurality of inverting circuits interconnected in the form of a ring and in which pulse signals are sequentially inverted by the inverting circuits to be circulated. In each of the above-described digitally controlled oscillation circuits, a second counting means counts the number of the circulations of a pulse signal within the pulse circulating circuit and outputs a detection signal indicating when the count value reaches high order bit data among the digital data input from the outside; an input data outputting means updates the input data output to the signal selection means according to the low order bit data among the digital data input from the outside; the number of circulations counted by the second counting means is incremented by one if when the updated value reaches the high order bits; and the pulse signal outputting means outputs a pulse signal when a detection signal is output by the second counting means and a delayed signal is selected by the signal selection means. Further, when a detection signal is output by the second counting means, a count control means initializes the count value in the second counting means and causes it to resume counting.

Specifically, when pulse signals are repeatedly generated in a cycle corresponding to digital data input from the outside, if a delay circuit constituted by simply connecting delay elements is used, the number of the delay elements constituting the delay circuit must be increased as the operating time increases. Since it is necessary to configure the delay circuit using an infinite number of delay elements in order to cause continuous oscillation, the delay circuit is constituted by a pulse circulating circuit consisting of a plurality of inverting circuits interconnected in the form of a ring so that delay signals will be sequentially and successively output from the pulse circulating circuit even if the pulse circulating circuit is configured using a small number of inverting circuits. When the delay circuit is thus constituted by a pulse circulating circuit, the cycle (time) corresponding to digital data can not be preferably measured from the delay signals from the pulse circulating circuit in the digitally controlled oscillation circuit according to the third aspect of the invention. So, according to the present invention, a second counting means and a counting control means are provided in the digitally controlled oscillation circuit to allow the output cycle of a pulse signal to be controlled according to the number of the circulations of the pulse signal within the pulse circulating circuit and the positions at which delayed signals are output from the pulse circulating circuit.

This makes it possible to output pulse signals continuously for a long time in a cycle in accordance with digital data with a small number of delay elements (inverting elements) constituting the delay circuit (pulse circulating circuit), thereby simplifying the configuration of a device and reducing the size of the device.

In addition, the present invention can be applied to a combination of a pulse phase difference encoding device and an oscillation device as described above, and a delay circuit may be shared by such devices.

For example, when a PLL is configured utilizing the above-described pulse phase difference encoding circuit and digitally controlled oscillation circuit, the configuration of the device can be simplified to make the device compact because there is no need for providing those circuits with a delay circuit unlike the conventional devices. Further, since one delay circuit is shared by those devices, the matching of the time resolution of those devices can be realized. For example, by inputting digital data obtained by the pulse phase difference encoding circuit to the digitally controlled oscillation circuit as it is, an oscillation signal can be output from the digitally controlled oscillation circuit in complete synchronism with the input signal to the pulse phase difference encoding circuit.

In addition, in this combined device, the delay circuit can be constituted by a pulse circulating circuit which has a plurality of inverting circuits interconnected in the form of a ring and which circulates a pulse signal by sequentially inverting it by the inverting circuits.

This makes it possible to continuously perform the encoding of pulse phase differences and the outputting of pulse signals with a small number of delay elements (inverting elements) constituting the delay circuit (pulse circulating circuit), thereby simplifying the configuration of a device and reducing the size of the device.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

An embodiment of the present invention will now be described with reference to the accompanying drawings.

Figure 1:
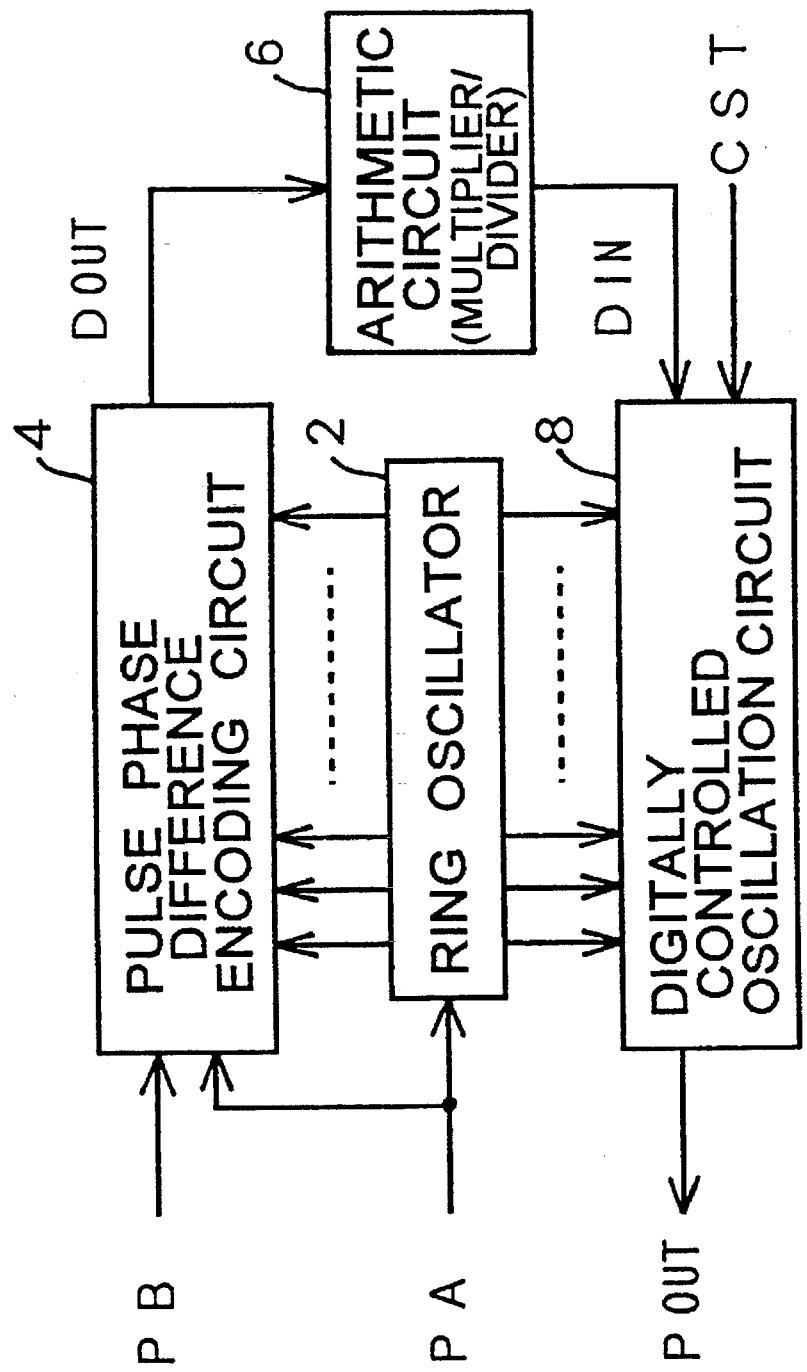
FIG. 1 is a block diagram showing an overall configuration of a frequency converter of an embodiment of the present invention.

FIG. 1 is a block diagram showing an overall configuration of a frequency converter according to an embodiment of the present invention wherein a reference signal PB which is input from the outside is subjected to frequency division or frequency multiplication to generate an output signal (pulse signal) POUT at a predetermined frequency.

As shown in FIG. 1, the frequency converter of the present embodiment is configured as a combination of pulse phase difference encoding device and an oscillation device comprising a ring oscillator 2 which is constituted by a multiplicity of inverting circuits connected in the form of a ring and which circulates a pulse signal by sequentially delaying it by means of the inverting operation of the inverting circuits when a control signal PA at a high level is being input from the outside, a pulse phase difference encoding circuit 4 which converts the phase difference between a rise and the next rise (i.e., the cycle) of the reference signal PB into a binary digital value DOUT based on delayed signals sequentially output by predetermined inverting circuits forming a part of the ring oscillator 2, an arithmetic circuit 6 which multiplies or divides the binary digital value DOUT obtained by the pulse phase difference encoding circuit 4 by a predetermined value to generate control data CD representing the output cycle of a pulse signal POUT, and a digitally controlled oscillation circuit 8 which outputs the pulse signal POUT in a cycle which is obtained by dividing or multiplying the reference signal PB based on the control data CD output by the arithmetic circuit 6 and the delayed signals sequentially output by the ring oscillator 2.

Figure 2:
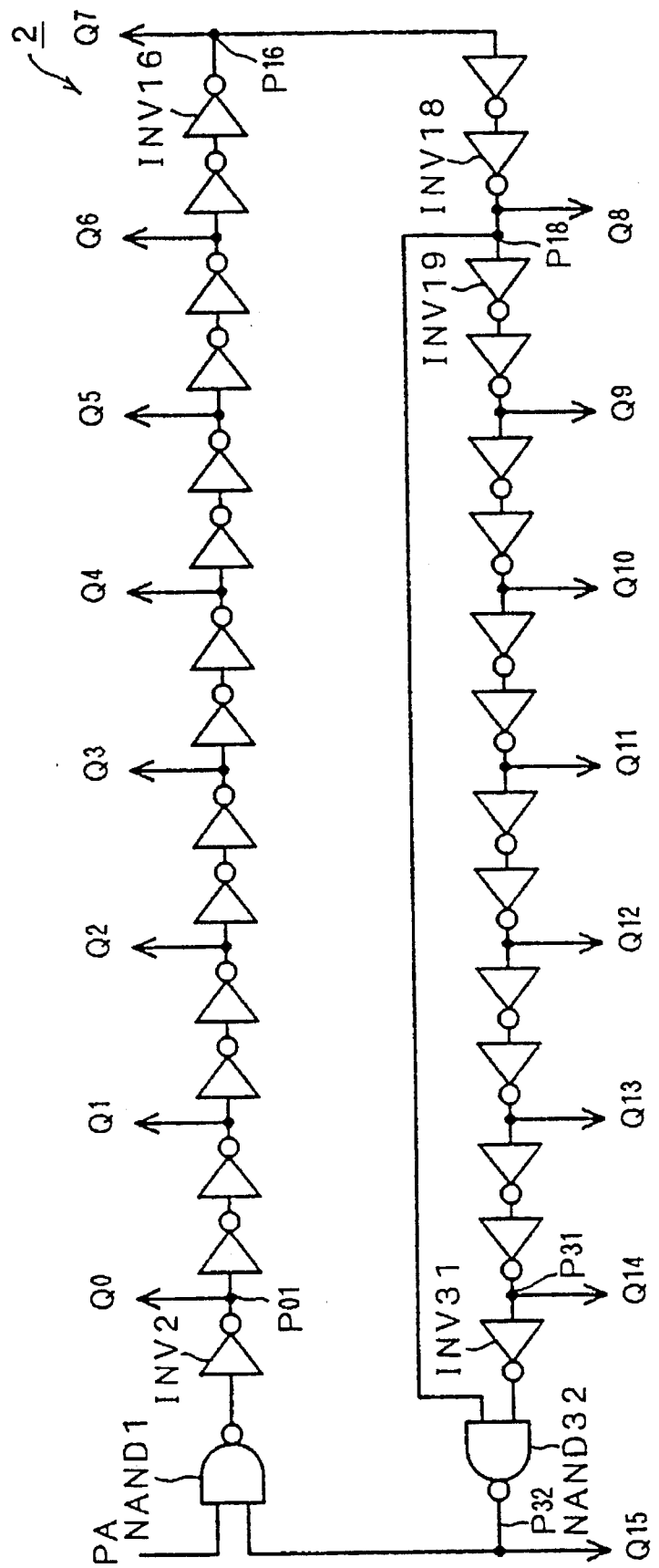
FIG. 2 is an electrical circuit diagram showing a configuration of a ring oscillator of an embodiment of the present invention.

First, as shown in FIG. 2, the ring oscillator 2 includes two two-input NAND gates (hereinafter simply referred to as NAND gates) NAND1 and NAND32 and thirty inverters INV2 through INV31 as the inverting circuits. The input terminal of each of these circuits is connected to the input terminal of the next stage. An external control signal PA is input to the input terminal of the NAND gate NAND1 which is not connected to the NAND gate NAND32 (this input terminal is hereinafter referred to as an activation terminal) while the output signal of the inverter INV18 is input to the input terminal of the NAND gate NAND32 which is not connected to the inverter INV31 (this input terminal is hereinafter referred to as a control terminal). On the other hand, the output terminals of the inverting circuits connected at stages which are in even-numbered places when counted from the NAND gate NAND1 are provided with output terminals Q0 through Q15, respectively. Each of these output terminals Q0 through Q15 is connected to the pulse phase difference encoding circuit 4 and the digitally controlled oscillation circuit 8.

Figure 3:
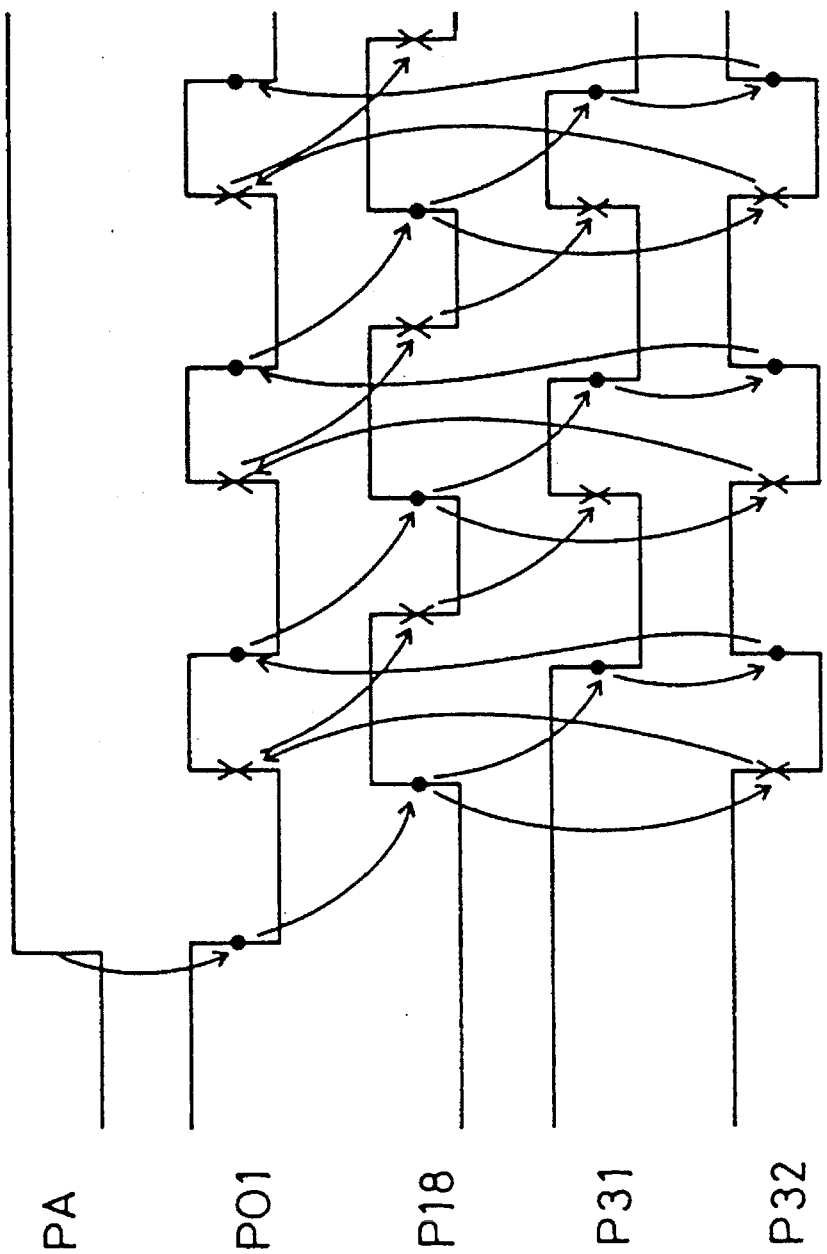
FIG. 3 is a time chart illustrating the operation of the ring oscillator shown in FIG. 2.

The operation of the ring oscillator 2 having such a configuration will now be described with reference to FIG. 3.

When the control signal PA is at a low level, the output P01 of the NAND gate NAND1 becomes the high level. Then, the output of the inverters at stages in even-numbered places counted from the NAND gate NAND1 becomes the low level while the output of the inverters at stages in odd-numbered places becomes the high level. This results in a stable state. In this state, the output P18 of the inverter INV18 input to the control terminal of the NAND gate NAND32 is at the low level. Therefore, the NAND gate NAND32 exceptionally outputs the high level in spite of the fact that it is connected at an even-numbered stage. In other words with such a configuration, the input and output signals of the NAND gate NAND1 are both at the high level, and the NAND gate NAND1 starts an inverting operation at the subsequent transition of the control signal from the low level to the high level.

When the subsequent transition of the control signal PA from the low level to the high level occurs, the output P01 of the NAND gate NAND1 changes from the high level to the low level. As a result, the output of the subsequent inverters is sequentially inverted. The output of the inverters at odd-numbered stages changes from the high level to the low level, and the output of the inverters at even-numbered stages changes from the low level to the high level. In the following description, an edge of a pulse signal which sequentially circulates on the ring oscillator 2 as falling outputs of the inverting circuits at odd-numbered stages and rising outputs of the inverting circuits at even-numbered stages is referred to as a main edge and indicated by the dots in FIG. 3.

When this main edge arrives at the inverter INV18 to cause a transition of the output P18 of the inverter INV18 from the low level to the high level, since the output level of the inverter INV3 is still at the high level, both of two input signals at the NAND gate NAND32 become the high level. Thus, the NAND gate NAND32 starts an inverting operation, the output thereof being inverted from the high level to the low level. In the following description, when the main edge is input to the NAND gate NAND32 through the control terminal thereof and is inverted by the NAND gate NAND32 to become an edge of a pulse signal sequentially circulating on the ring oscillator 2 as rising outputs of the inverting circuits at odd-numbered stages and falling outputs of the inverting circuits at even-numbered stages, such an edge is referred to as a reset edge and is indicated by the X's in FIG. 3. This reset edge is circulated on the ring oscillator 2 along with the main edge generated by the NAND gate NAND1.

The main edge is sequentially inverted by the inverters subsequent to the inverter INV18 and is input to the NAND gate NAND32 as a result of the inversion of the output of the inverter INV31 from the high level to the low level. At this time, since the input signal at the control terminal of the NAND gate NAND32, i.e., the output signal of the inverter INV18, is at the high level, the sequential inversion of the main edge is continued at the NAND gate NAND32 and the subsequent inverters starting with NAND gate NAND1 to propagate the main edge on the ring oscillator 2.

The reason why the output signal of the inverter INV18 is still at the high level when the main edge has arrived the NAND gate NAND32 via the inverters INV19 through INV31 as described above is the fact that the number of the inverters ranging from the INV19 to INV31 are 13 while the number of the inverters in the range from the NAND gate NAND32 to the inverter INV18 is 19 and, therefore, the main edge is input to the NAND gate NAND32 before the reset edge is propagated from the NAND gate NAND32 to the inverter INV18.

On the other hand, the reset edge generated by the NAND gate NAND32 arrives at the inverter INV18 again via inverters including the NAND gate NAND1 to invert the signal level at the control terminal of the NAND gate NAND32 from the high level to the low level. At this time, since the signal input from the inverter INV31 to the NAND gate NAND32 has been already changed to the low level by the main edge, the output of the NAND gate NAND32 will not change, and the reset edge is sequentially propagated to the NAND gate NAND32 via the normal route from the inverter INV18 and through the inverters INV19 through INV31.

When the reset edge arrives at the inverter INV31, the signal input from the inverter INV31 to the NAND gate NAND32 is inverted from the low level to the high level. At substantially the same time, the main edge arrives at the inverter INV18 to invert the signal input to the control terminal of the NAND gate NAND32 also from the low level to the high level. This is because the main and reset edges travel through completely the same number of inverting circuits before they arrive at the NAND gate NAND32. Specifically, the main edge travels from the NAND gate NAND1 to make a round through the ring oscillator 2 via the normal route and arrives at the inverter INV18 after passing through the NAND gate NAND1 again while the reset edge is generated as a result of the activation of the inverting operation of the NAND gate NAND32 after the main edge arrives at the inverter INV18 from the NAND gate NAND1 and makes a round through the ring oscillator 2 via the normal route.

In the ring oscillator 2 in the present embodiment, the inversion response time of the inverters at even-numbered stages is preset so that the output of a fall is faster than the output of a rise and, conversely, the inversion response time of the inverters at odd-numbered stages is preset so that the output of a rise is faster than the output of a fall. As a result, the reset edge arrives at the NAND gate NAND32 slightly earlier than the main edge.

Therefore, when the reset edge inverts the output of the inverter INV31 from the low level to the high level, the signal input to the control terminal of the NAND gate NAND32 is still at the low level. So, the output of the NAND gate NAND32 is not inverted and, when the main edge arrives at the inverter INV18 with a slight delay to invert the signal input to the control terminal of the NAND gate NAND32 from the low level to the high level, the output of the NAND gate NAND32 is inverted from the high level to the low level. Thus, the reset edge is temporarily disappears at this point and is regenerated by the main edge.

Thereafter, the above-described operation is repeated and the reset edge is regenerated each time the main edge makes one round and travels round the ring oscillator 2 along with the main edge. When the control signal becomes the low level, such a series of operations is stopped and the above-described initial state is restored.

As described above, in the ring oscillator 2 in the present embodiment, two pulse edges (main and reset edges) which are generated at different timing are circulated in the same path of circulation. The output of the NAND gate NAND1 is inverted by the reset edge before the main edge which has been generated by itself returns thereto while the output of the NAND gate NAND32 is inverted by the main edge before the reset edge which has been generated by itself returns thereto. Thus, a pulse signal is being constantly circulated. Each of the output terminal Q2 through Q15 generates a pulse signal whose cycle is equal to a period 32 times the time of the inversion operation at each of the inverting circuits Td (32·Td).

A description will now be made on the pulse phase difference encoding circuit 4 which converts a phase difference between reference signals PB into a binary digital value DOUT using the above-described ring oscillator 2.

Figure 4:
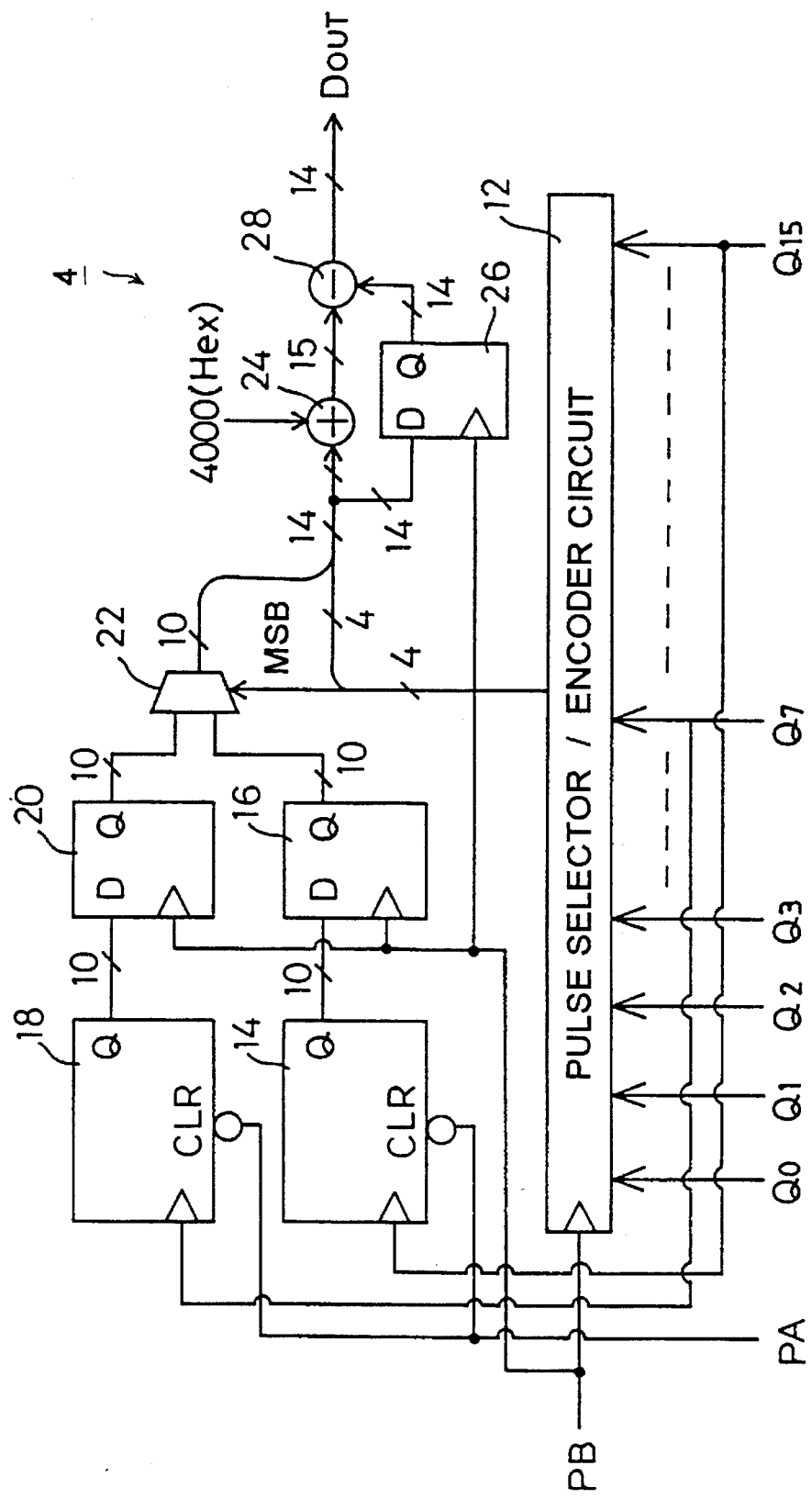
FIG. 4 is an electrical circuit diagram showing a configuration of a pulse phase difference encoding circuit of an embodiment of the present invention.

As shown in FIG. 4, the pulse phase difference encoding circuit 4 in the present embodiment comprises a pulse selector/encoder circuit 12 which receives the output signals of the output terminals Q0 through Q15 of the ring oscillator 2, detects the inverting circuit in the ring oscillator 2 at which the main edge has arrived when the reference signal PB changes from the low level to the high level (the timing at which a rise of the reference signal PB occurs) and encodes such a position into a binary digital value consisting of four bits (D0 through D3), a first counter 14 which counts how many times the main edge has been circulated in the ring oscillator 2 from the output P32 of the NAND gate NAND32 in the ring oscillator 2 output from the output terminal Q15, a first latch circuit 16 which latches the output consisting of 10 bits from the first counter 14 at the timing at which a rise of the reference signal PB occurs, a second counter 18 which counts how many times the main edge has been circulated in the ring oscillator 2 from the output P16 of the inverter INV16 in the ring oscillator 2 output from the output terminal Q7, a second latch circuit 20 which latches the output consisting of 10 bits from the second counter 18 at the timing at which a rise of the reference signal PB occurs, a multiplexer 22 to which the output consisting of 10 bits from each of the first latch circuit 16 and the second latch circuit 20 is input and which selects the output consisting of 10 bits from either the first latch circuit 16 or the second latch circuit 20 based on the value of the most significant bit (MSB) of the 4-bit binary digital value (D0 through D3) output by the pulse selector/encoder circuit 12 and outputs it as high order bit data (D4 through D13) for the 4-bit binary digital value (D0 through D3) output by the pulse selector/encoder circuit 12, an adder 24 which adds high order bit data D14 having a value of 1 (4000H) to a 14-bit binary digital value (D0 through D13) consisting of the 10-bit binary digital value (D4 through D13) from the multiplexer 22 and the 4-bit binary digital value (D0 through D3) from the pulse selector/encoder circuit 12 and outputs the result as a 15-bit binary digital value (D0 through D14), a data latch circuit 26 which latches the above-described 14-bit binary digital value (D0 through D13) at the timing at which a rise of the reference signal PB occurs, and a subtracter 28 which subtract the binary digital value (D0 through D13) latched by the data latch circuit 26 at the timing of the previous rise of the reference signal PB from the 15-bit binary digital value (D0 through D14) output by the adder 24 to generate a binary digital value DOUT representing the period between a rise of the reference signal PB and the next rise thereof (the cycle of the reference signal PB).

Figure 5:
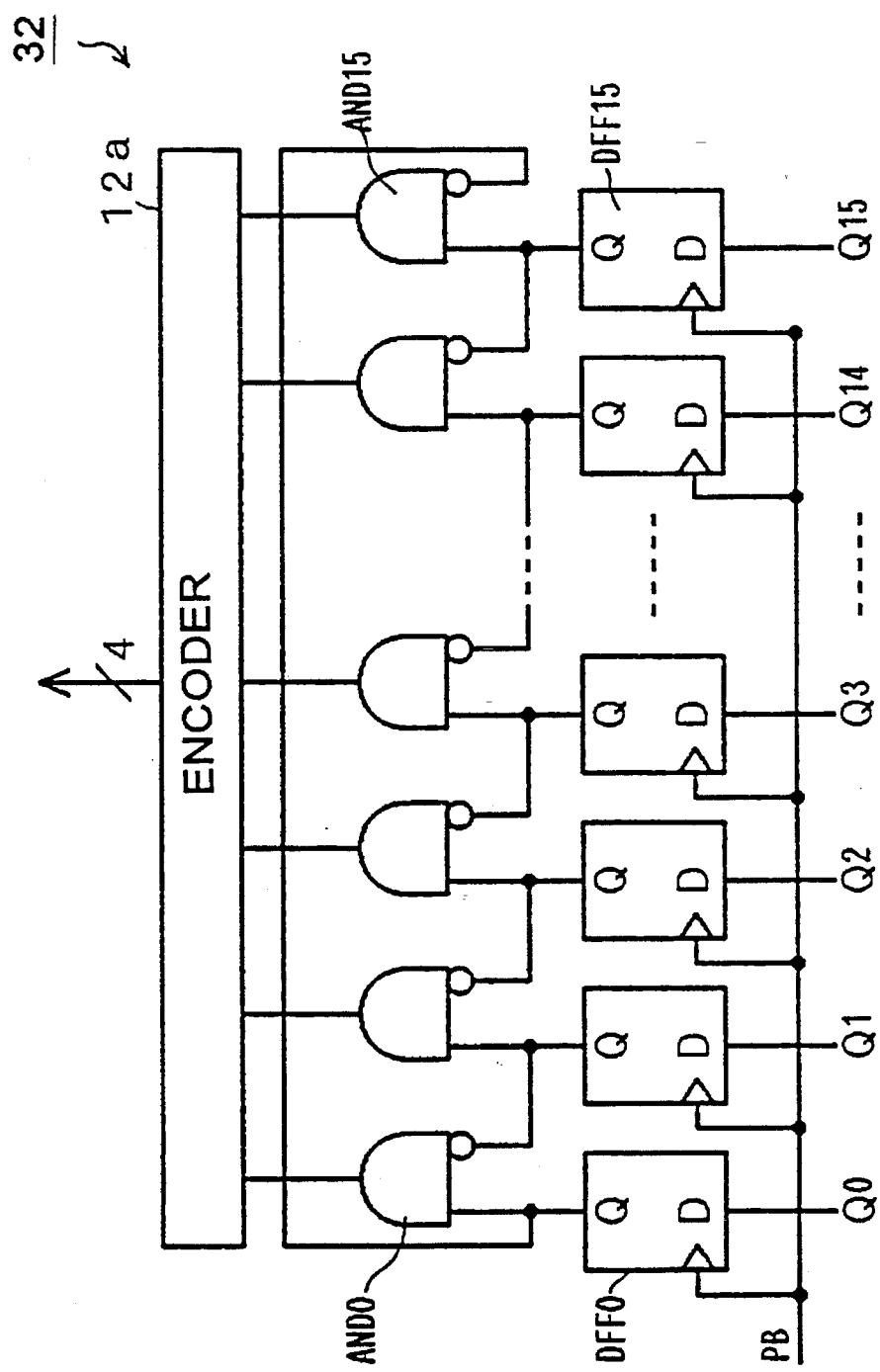
FIG. 5 is an electrical circuit diagram showing a configuration of a pulse selector/encoder circuit in the pulse phase difference encoding circuit shown in FIG. 4.

As shown in FIG. 5, the pulse selector/encoder circuit 12 comprises D flip-flops DFF0 through DFF15 which have input terminals D to which the output terminals Q0 through Q15 of the ring oscillator 2 are respectively connected and which latch the levels of the signals at the output terminals Q0 through Q15, respectively, at a rise of the reference signal PB, AND gates AND0 through AND15 to which the output of D flip-flops DFF0 through DFF15 is input as it is at the respective group of input terminals and to which the output of the subsequent D flip-flops DFF1 through DFF15 and DFF0 is input after being inverted at another group of input terminals, and an encoder 12a which encodes the position of an AND gate ANDn whose output level is high from among the AND gates AND0 through AND15 into a 4-bit binary digital value (D0 through D3).

Figure 6:
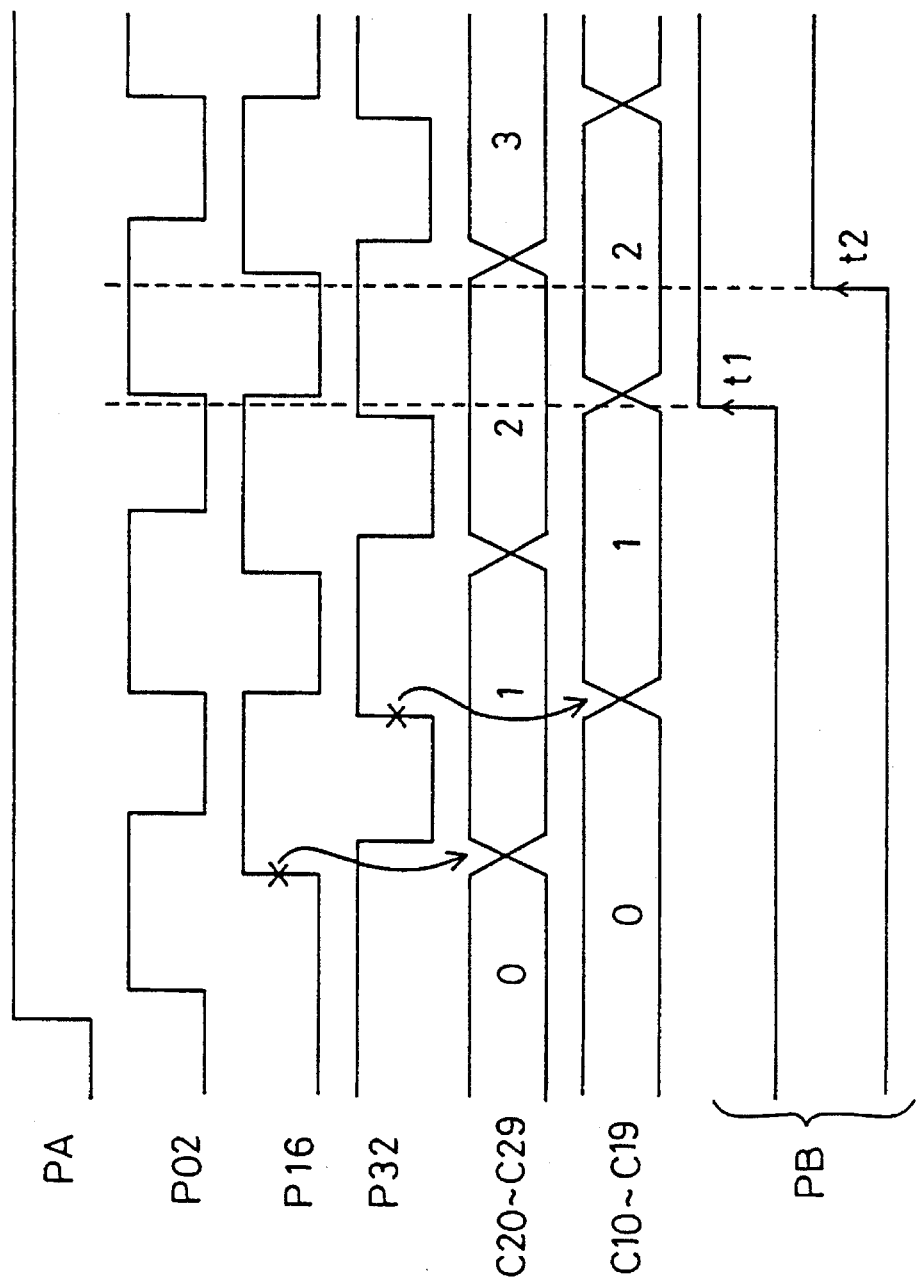
FIG. 6 is a time chart illustrating the operation of the pulse phase difference encoding circuit shown in FIG. 4.

In the pulse phase difference encoding circuit 4 in the present embodiment having such a configuration, as shown in FIG. 6, the counters 14 and 18 enabled for counting when the ring oscillator 2 is activated by the control signal PA to start circulating a pulse signal; the second counter 18 counts up when the main edge passes through the inverter INV16 at the 16th stage of the ring oscillator 2; and the first counter 14 counts up when the main edge passes through the NAND gate NAND32 at the 32th stage of the ring oscillator 2. Specifically, as shown in FIG. 6, the timing at which output of the first counter 14 (C10 through C19) varies is shifted from the timing at which the output of the second counter 18 (C20 through C29) varies by a period of time required for the main edge to go half round the ring oscillator 2.

If a rise of the reference signal PB occurs while the ring oscillator 2 is operating in such a circulating mode, the first latch circuit 16 latches the output of the first counter 14 (C10 through C19) and the second latch circuit 20 latches the output of the second counter 18 (C20 through C29).

On the other hand, when a rise of the reference signal PB occurs as described above, a clock is supplied to the D flip-flops DFF0 through DFF15 in the pulse selector/encoder circuit 12. The D flip-flops DFF0 through DFF15 latch and output the signal levels at the output terminals Q0 through Q15 of the ring oscillator at that time.

For example, assume that the reference signal PB rises at timing t1 as shown in FIG. 6, i.e., if it rises when the main edge is at the NAND gate NAND32 at the 32th stage. Then, the output signal of the NAND gate NAND32 has been changed to the high level but the output signal of the inverter INV2 at the second stage is still at the low level. So, only the output of the rightmost AND gate AND15 from among the AND gates AND0 through AND15 shown in FIG. 4 is output to the encoder 12a.

Specifically, the pulse signal output by an inverter at an even-numbered stage in the ring oscillator 2 is input to the D flip-flops DFF0 through DFF15 of the encoder circuit 12. Since this signal rises at the main edge and falls at the reset edge, the output of a D flip-flop DFFn among the D flip-flops DFF0 through DFF15 which latches the output from an inverting circuit in the ring oscillator 2 at which the main edge has arrived becomes the high level while the output of the next D flip-flop DFF(n+1) becomes the low level. In the configuration of the present embodiment. the output of each of two consecutive D flip-flops among the D flip-flops DFF0 through DFF15 is input to the AND gates AND0 through AND15; only the output of an AND gate ANDn associated with a D flip-flop DFFn the output of which is at the high level and which is followed by a D flip-flop DFF(n+1) whose output is at the low level becomes the high level; and the signal of such an AND gate is output to the encoder 12a to allow the encoder 12a to generate a binary digital value (D0 through D3) representing the position of the inverting circuit at which the main edge has arrived in the ring oscillator 2. For example, if the reference signal PB rises when the main edge has arrived the NAND gate NAND32 at the 32th stage to render the output level of the AND gate AND15 high as described above, the encoder 12a outputs a binary digital value (1111) which is a binary number obtained by encoding a value 15 corresponding the position of the AND gate.

In the pulse phase difference encoding circuit 4 in the present embodiment, the MSB of the binary digital value (D0 through D3) output by the pulse selector/encoder circuit 12, i.e., D3, is input to the multiplexer 22. The multiplexer 22 outputs the 10-bit output of the first latch circuit 16 (C10 through C19) as a 10-bit binary digital value (D4 through D13) if the value of D3 is 1 and outputs the 10-bit output of the second latch circuit 20 as a 10-bit binary digital value (D4 through D13) if the value of D3 is 0.

For example, when the reference signal PB rises at the timing t1 shown in FIG. 6, the main edge has arrived at the NAND gate NAND32 at the 32th stage of the ring oscillator 2. Then, the value of D3 output by the pulse selector/encoder circuit 12 is 1. In this case, the 10-bit output of the first latch circuit 16 is selected, and the multiplexer 22 outputs (0000000001). When the reference signal PB rises at the timing t2 shown in FIG. 6, the main edge has already passed through the inverter INV2 at the second stage of the ring oscillator 2 and has not arrived at the inverter INV16 at the 16th stage. Then, the value of D3 output by the pulse selector/encoder circuit 12 is 0. In this case, the 10-bit output of the second latch circuit 20 (C20 through C29) is selected, and the multiplexer 22 outputs (0000000010).

As described above, in the pulse phase difference encoding circuit 4 in the present embodiment, two counters 14 and 18 and two latch circuits 16 and 20 are provided, and the multiplexer 22 selects the output of the second latch circuit 20 if the value of the MSB of the binary digital value (D0 through D3) output by the pulse selector/encoder circuit 12 is and selects the output of the first latch circuit 16 if the value of the MSB of the binary digital value (D0 through D3) is 1. This is because it takes a certain period of time before the output of the counters 14 and 18 is stabilized. With such an arrangement, a stable and accurate count value is always output by the multiplexer 22 by selecting the counter to which the output signal of the inverting circuit preceding the position of the main edge at the time of a rise of the reference signal PB by at least a half round of the ring oscillator 2 is input as a clock.

Next, the 10-bit binary digital value (D4 through D13) output by the multiplexer 22 as described above along with the 4-bit binary digital value (D0 through D3) output by the pulse selector/encoder circuit 12 is input to the adder 24 and the data latch circuit 26 as a 14-bit binary digital value (D0 through D13). The adder 24 adds high order bit data D14 having a value of 1 (=4000 (HEX)) to this 14-bit binary digital value (D0 through D13) and outputs a 5-bit binary digital vale (D0 through D14) as a result of such addition to the subtracter 28.

The data latch circuit 26 latches the 14-bit binary digital value (D0 through D13) input by the pulse selector/encoder circuit 12 and the multiplexer 22 each time the reference signal PB rises and outputs the latched binary digital value (D0 through D13) to the subtracter 28.

Since the data latched by the data latch circuit 26 at this time are a binary digital value (D0 through D13) which has been already output by the multiplexer 22 and the pulse selector/encoder circuit 12 at the time of a rise of the reference signal PB, the data are the binary digital value (D0 through D13) which has been generated by the multiplexer 22 and the pulse selector/encoder circuit 12 at the time of the previous rise of the reference signal PB (i.e., in the preceding cycle). Normally, the binary digital value (D0 through D13) of the reference signal PB latched by this data latch circuit 26 in the preceding cycle and the 15-bit binary digital value (D0 through D14) which has been generated in the current cycle by a rise of the reference signal PB and which has been added with the most significant bit D14 by the adder 24 are input to the subtracter 28.

The subtracter 28 subtracts the binary digital value (D0 through D13) in the preceding cycle of the reference signal PB input by the data latch circuit 26 from the latest binary digital value (D0 through D14) input by the adder 24, calculates the difference, and outputs the result of the calculation as a 14-bit binary digital value DOUT representing the cycle of the reference signal PB.

Specifically, in the pulse phase difference encoding circuit 4 in the present embodiment, the number of the circulations of the main edge in the ring oscillator 2 after the ring oscillator 2 is activated by the control signal PA; a binary digital value representing the time of a rise of the reference signal PB each time the reference signal PB rises from the result of the counting and binary digital value representing the position of the main edge in the ring oscillator 2 output by the pulse selector/encoder circuit 12; and the difference between the latest binary digital value thus generated and the binary digital value which has been previously generated is output to the arithmetic circuit 6 as a binary digital value DOUT representing the cycle of the control signal PA.

This allows a pulse signal circulating operation of a ring oscillator to be continuously performed without the need for resetting the ring oscillator each time a phase difference between input signals is encoded as in conventional pulse phase difference encoding circuits.

When the subtracter 28 calculates the difference between the latest binary digital value generated at the timing of a rise of the reference signal PB and the previously generated binary digital value, the adder 24 adds the most significant bit D14 having a value of 1 to the latest binary digital value to obtain a 15-bit binary digital value. The reason is that the number of the circulations of a pulse signal in the ring oscillator 2 will otherwise return to the minimum value (=0) when the output value thereof reaches the maximum value (=3FFF(HEX)) because the number is continuously counted by the counters 14 and 18.

Specifically, if the output of the counters 14 and 18 changes from the maximum value to the minimum value during the period between a rise of the reference signal PB and the next rise of the same, the previous binary digital value (D0 through D13) latched by the data latch circuit 23 exceeds the latest binary digital value (D0 through D13) obtained by the multiplexer 22 and the pulse selector/encoder circuit 12. If the former is subtracted from the latter as it is, the subtraction will result in a negative value. According to the present embodiment, a binary digital value DOUT corresponding to the cycle of the reference signal PB is always obtained by adding the most significant bit data D14 having a value of 1 to the latest binary digital value (D0 through D13) to generate a 15-bit binary digital value (D0 through D14), by subtracting the binary digital value (D0 through D13) latched by the data latch circuit 26 from this value, and by outputting only the 14 low order bits of the result of the subtraction.

Next, the binary digital value DOUT representing the reference signal PB obtained by the pulse phase difference encoding circuit 4 as described above is multiplied or divided by a predetermined value at the arithmetic circuit 6 and the result is output as control data CD (14 bits) for the digitally controlled oscillation circuit 8.

Upon the receipt of the control data CD, the digitally controlled oscillation circuit 8 outputs a pulse signal (oscillation signal) POUT in a cycle corresponding to the control data CD. Specifically, the digitally controlled oscillation circuit 8 outputs the pulse signal POUT in a cycle which is obtained by the multiplying the cycle of the reference signal PB by the predetermined value, i.e. a cycle obtained by dividing the frequency of the reference signal PB by the predetermined value if the control data CD is a value obtained by multiplying the binary digital value DOUT by the predetermined value and outputs the pulse signal POUT in a cycle obtained by dividing the cycle of the reference signal PB by the predetermined value, i.e., a cycle obtained by multiplying the frequency of the reference signal PB by the predetermined value if the control data CD is a value obtained by dividing the binary digital value DOUT by the predetermined value.

The configuration and operation of this digitally controlled oscillation circuit 8 will now be described.

Figure 7:
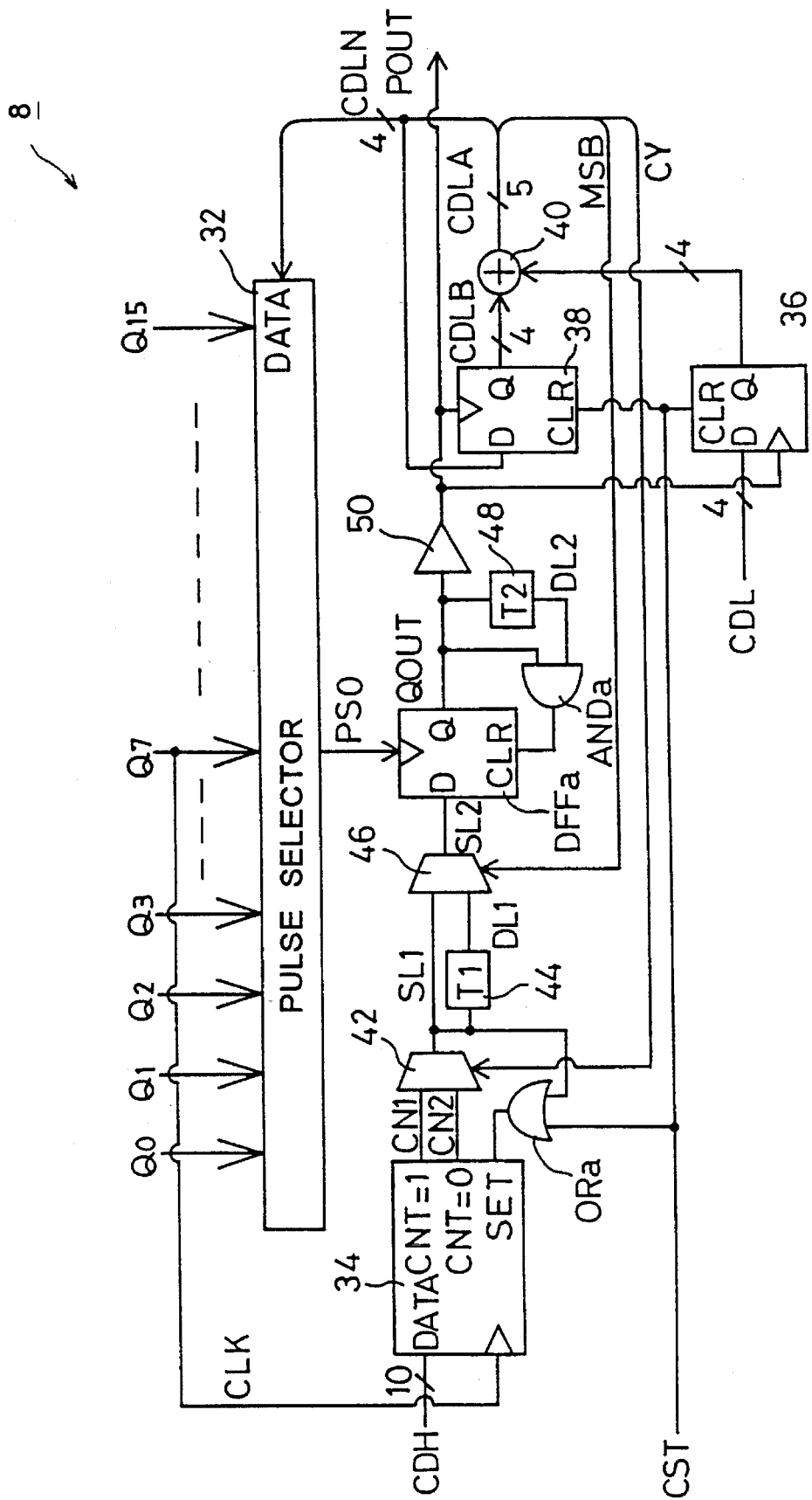
FIG. 7 is an electrical circuit diagram showing a configuration of a digitally controlled oscillation circuit in an embodiment of the present invention.

As shown in FIG. 7, the digitally controlled oscillation circuit 8 in the present embodiment comprises a pulse selector 32 which receives signals from the output terminal Q0 through Q15 of the ring oscillator 2, selects the output signal of a predetermined output terminal corresponding to select data CDLN to be described later, and outputs the signal as a select signal PSO, a down counter 34 in which ten high order bits of the 14-bit control data CD input from the arithmetic circuit 6 are preset as counter data CDH and which counts at the timing of a rise of the output signal of the output terminal Q7 of the ring oscillator 2, renders the level of an output signal CN1 high if the count value DCD is 1, and renders the level of an output signal CN2 high if the count value DCD is 0, a latch circuit 36 which is reset by a reset signal CST input from the outside when the oscillation circuit 8 is activated and which latches four low order bits of the 14-bit control data CD input by the arithmetic circuit 6 at the timing of a rise of the pulse signal POUT as reference select data CDL, a latch circuit 38 which is also reset by the reset signal CST input from the outside and which latches the select data CDLN which has been input to the pulse selector 32 at that time at the timing of a rise of the pulse signal POUT, and outputs the latched data as old select data CDLB, an adder 40 which adds the old select data CDLB output by the latch circuit 38 and the reference select data CDL output by the latch circuit 36 to generate 5-bit sum data CDLA, outputs the low order 4 bits thereof to the pulse selector 32 and the latch circuit 38 as the above-described select data CDLN, and outputs the value of the fourth low order bit of the sum data CDLA (i.e., the most significant bit of the select data CDLN) as a signal MSB, a selector 42 which selects the output signal CN1 of the down counter 34 when a carry signal CY is at the low level, selects the output signal CN2 of the down counter 34 when, conversely, the carry signal CY is at the high level, and outputs the selected signal as an output signal SL1, the carry signal being the most significant bit of the 5-bit sum data CDLA output by the adder 40, an OR gate ORa which ORs the above-described reset signal CST and the output signal SL1 of the selector 42 and outputs a signal representing the logical OR as a set signal for the down counter 34, a delay line 44 which delays the output signal SL1 of the selector 34 by a time T1 required for a pulse signal to make a half round through the ring oscillator 2 and outputs a delayed signal DL1, a selector 46 which selects the output signal SL1 of the selector 42 when the signal MSB output by the adder 40 is at the low level, selects the output the delayed signal DL1 from the delay line 44 when, conversely, the signal MSB is at the high level, and output the selected signal as an output signal SL2, a D flip-flop DFFa having a clear terminal which latches the output signal SL2 of the selector 46 at the timing of the rise of the select signal PSO output by the pulse selector 32 and outputs a latch signal QOUT, a delay line 48 which delays the latch signal QOUT from the D flip-flop DFFa by a predetermined time T2 and outputs a delayed signal DL2, and an AND gate ANDa which ANDs the delayed signal DL2 output by the delay line 48 and the latch signal QOUT from the D flip-flop DFFa and outputs a signal representing the logical AND as a clear signal for the D flip-flop DFFa, and an amplifier 50 which amplifies the latch signal QOUT from the D flip-flop DFFa and output it as the pulse signal POUT.

The output signals from the output terminals Q0 through Q15 provided at the ring oscillator 2 are input to the pulse selector 32 and, from among those signals, the pulse selector 32 selects and outputs the signal which is assigned a number corresponding to the select data CDLN which is the four low order bits of the sum data CDLA (5 bits) generated by the adder 40. For example, the pulse selector 32 outputs the output signal of the output terminal Q1 as the select signal PSO if the select data CDLN is "0001" representing a value of 1 and outputs the output signal of the output terminal Q15 as the select signal PSO if the select data CDLN is "1111" representing a value of 15.

The down counter 34 is a known counter having a set terminal SET to which the set signal from the OR gate ORa is input. If the signal from the output terminal Q7 of the ring oscillator 2 (hereinafter referred to as a clock signal CLK) rises when this set signal is at the high level, ten high order bits of the control data CD are preset as the count data CDH. On the other hand, when the set signal is at the low level, the count value DCD is decremented by one each time the clock signal CLK from the ring oscillator 2 rises to render the level of the output signal CN1 high when the count value DCD is 1 and to render the level of the output signal CN2 high when the count value DCD is 0.

The operation of the digitally controlled oscillation circuit 8 having the above-described configuration will now be described.

First, ten high order bits of the control data CD are preset in the down counter 34 as the count data CDH at the timing of a rise of the clock by keeping the reset signal CST at the high level for a predetermined period of time, and this oscillation circuit 8 is initialized by resetting the latch circuits 36 and 38 to clear the internal data.

In this initialized state, since the latch circuits 36 and 38 are reset, all of the 4-bit data output by the latch circuits 36 and 38 become zero and all of the 5-bit sum data CDLA output by the adder 40 also become zero. Therefore, in this initialized state, "0000" representing a value of 0 is input to the pulse selector 32 as the select data CDLN, and the pulse selector 32 outputs the output signal of the output terminal of the ring oscillator 2 as the select signal PSO. Further, in this initialized state, ten high order bits of the control data CD are preset as the count data CDH at the timing of a rise of the clock signal CLK from the ring oscillator 2.

Thereafter, when the reset signal CST becomes the low level, the down counter 34 starts a counting operation to sequentially counts down the preset count data CDH each time the clock signal CLK from the ring oscillator 2 rises. However, since all the 5-bit sum data CDLA output by the adder 40 are zero at this time, a low level signal is input to each of the selectors 42 and 46. Then, the selector 42 selects the output signal CN1 of the down counter 34 and outputs the output signal SL1 while the selector 46 selects the output signal SL1 of the selector 42 and outputs the output signal SL2.

Figure 8:
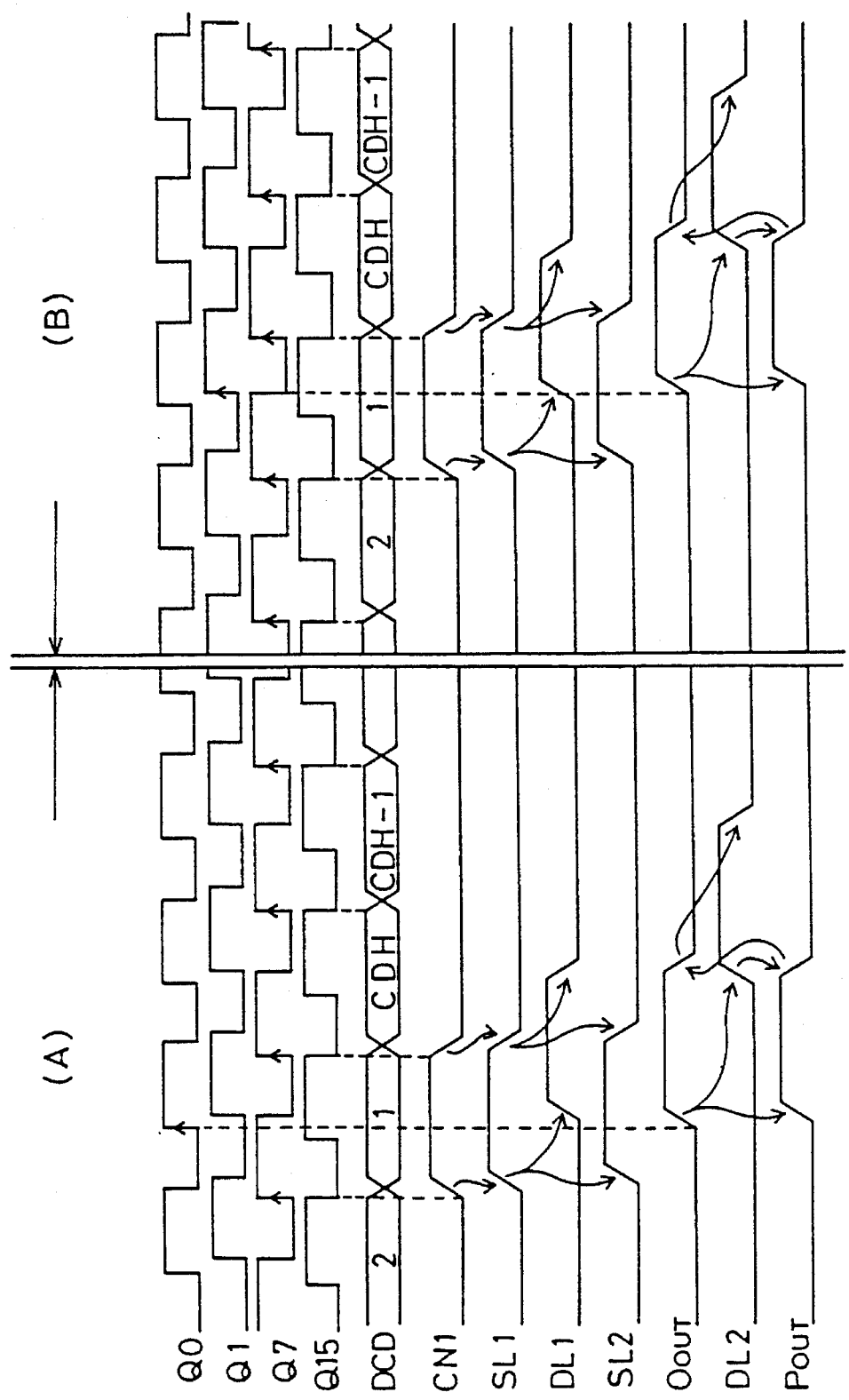
FIG. 8 is a time chart illustrating an operation of the digitally controlled oscillation circuit shown in FIG. 7 which directly follows the activation of the same.

As a result, immediately after the reset signal CST is switched from the high level to the low level (i.e., immediately after the activation), the input terminals D of the D flip-flops DFFa become the high level when the count value DCD in the down counter 34 is 1 as seen in the period (A) shown in FIG. 8. When the output of the output terminal Q0 of the ring oscillator 2 becomes the high level in such a state to cause the select signal PSO to be output from the pulse selector 32, the first pulse signal POUT is output from the oscillation circuit 8.

After outputting a latch signal QOUT (high level), the D flip-flop DFFa is cleared through the AND gate ANDa when a delayed signal DL2 from the delay line 48 delaying the latch signal QOUT by the predetermined time T2 has become the high level. Therefore, the latch signal QOUT and hence the pulse width of the pulse signal POUT match the delay time T2 of the delay line 48, and the oscillation circuit 8 outputs a pulse signal POUT having a predetermined pulse width.

When the first pulse signal POUT is output after the activation of the oscillation circuit 8 as described above, the latch circuit 36 latches the four low order bits of the control data CD as reference select data CDL and the latch circuit 38 latches the select data CDLN which is currently being input to the pulse selector 32 as old select data CDLB at the timing of the rise of this pulse signal POUT. As a result, the sum data CDLA output by the adder 40 is updated to a value obtained by adding four low order bits of the control data CD (reference select data CDL) and four low order bits of the current sum data CDLA (old select data CDLB whose value is 0 in this case). At this time, since the carry signal CY of the sum data CDLA output by the adder 40 is 0, the selector 32 continues to select the output signal CN1 of the down counter 34.

On the other hand, since the output signal SL1 of the selector 42 is input to the set terminal SET of the down counter 34, when the clock signal CLK from the ring oscillator 2 rises after the output signal SL1 of the selector 42 becomes the high level, ten high order bits of the control data CD are set gain as the count data CDH and the counting operation is resumed at the timing of the next rise of the clock signal CLK.

The down counter 34 resumes the counting operation as described above. When the count value DCD becomes 1 and the output signal CN1 becomes the high level, the output signal SL1 of the selector 42 and the output signal SL2 of the selector 46 sequentially become the high level as seen in the period (B) shown in FIG. 8.

At this time, the pulse selector 32 selects the output signal of the ring oscillator 2 in accordance with four low order bits of the sum data CDLA output by the adder 40 (i.e., the select data CDLN). For example, it selects the output signal of the output terminal Q1 of the ring oscillator 2 as seen in the period (B) shown in FIG. 8 if four low order bits of the control data CD latched by the latch circuit 36 as the reference select data CDL is "0001" which indicates a value of 1 and the sum data CDLA output by the adder 40 has become "0001".

In this case, therefore, when the output signal of the output terminal Q1 rises after the output signal SL2 of the selector 46 becomes the high level, the output signal QOUT of the D flip-flop DFFa becomes the high level and a second pulse signal POUT is output by the oscillation circuit 8.

When the second pulse signal POUT is output by the oscillation circuit 8 as described above, the latch circuit 38 latches again the select data CDLN which is currently being input to the pulse selector 32 as old select data CDLB while the latch circuit 36 latches again four low order bits of the control data CD as reference select data CDL. Therefore, if the four low order bits of the control data CD are still "0001", the sum data CDLA output by the adder 40 is updated to "00010". Thereafter, each time a pulse signal POUT is output, the sum data CDLA is added with four low order bits of the control data CD (reference select data CDL) latched by the latch circuit 36 to be updated.

For example, when sum data CDLA "01111" is output by the adder 40 as a result of the repetition of the above-described operation and the MSB which the fourth low order bit thereof becomes the high level, the pulse selector 32 selects the output signal of the output terminal Q15 of the ring oscillator 2 and the selector 46 selects a delayed signal DL1 from the delay line 44 which delays the output signal SL1 of the selector 42 by the time T1 required for a pulse signal to make a half round through the ring oscillator 2.

In this case, therefore, when the count value DCD in the down counter 34 becomes 1 and the output signal CN1 thereof becomes the high level, the output signal SL1 of the selector 42 becomes the high level and, after the time T1 elapses, the output signal SL2 of the selector 46 becomes the high level. When the output signal of the output terminal Q15 of the ring oscillator 2 rises thereafter, the output signal QOUT of the D flip-flop DFFa becomes the high level, and the next pulse signal POUT is output from the oscillation circuit 8.

The reason is that when the pulse selector 32 selects the output signal of any one of the output terminals Q8 through Q15, the D flip-flop DFFa latches the data immediately after the input data becomes the high level, which results in a possibility that the output signal QOUT from the D flip-flop DFFa becomes uncertain.

In summary, in the present embodiment, the output signal SL1 of the selector 42 is input to the D flip-flop DFFa as it is when the pulse selector 32 selects the output signal of any one of the output terminals Q0 through Q7 while the output signal SL1 of the selector 42 is delayed by the time T1 required for a pulse signal to make a half round through the ring oscillator 2 before it is input to the D flip-flop DFFa when the pulse selector 32 selects the output signal of any one of the output terminals Q8 through Q15. This makes it possible to always keep the time required for the D flip-flop DFFa to latch data input thereto after the data becomes the high level equal to or longer than the time required for a pulse signal to make a half round through the ring oscillator 2.

Next, the selector 42 selects the output signal CN2 which becomes the high level when the count value DCD in the down counter 34 is 0 when the carry signal CY of the sum data CDLA output by the adder 40 becomes the high level. In this case, therefore, a pulse signal POUT is output at the rise of a select signal PSO output by the pulse selector 32 after the number of the circulations of a pulse signal in the ring oscillator 2 reaches the number obtained by adding 1 to ten high order bits of the control data CD.

The reason is that the oscillation cycle will be shortened by the time required for a pulse signal to make one round through the ring oscillator 2 if the output terminal of the ring oscillator 2 at which the current pulse signal is obtained is at a stage preceding the output terminal at which the previous pulse signal was obtained, i.e., when the value of the select data CDLN input to the pulse selector 32 is smaller than the previous value because the down counter 34 counts down in a constant cycle (32·Td) in accordance with the clock signal CLK output by the output terminal Q7 of the ring oscillator 2.

As described above, in the digitally controlled oscillation circuit 8 according to the present embodiment, the number of the circulations of a pulse signal in the ring oscillator 2 is counted using the count data CDH which is ten high order bits of the control data CD output by the arithmetic circuit 6; an output signal from the ring oscillator 2 is selected using four low order bits of the 5-bit sum data CDLA (select data CDLN) which is obtained by sequentially adding the reference select data CDL which is four low order bits of the control data CD; and a pulse signal POUT is always repeatedly output in a constant cycle (=CDH×32·Td+CDL×2·Td) which is determined by the control data C and the inversion time Td of the inverting circuits in the ring oscillator 2 by adding or subtracting the carry signal CY of the sum data CDLA to or from the count value of the number of circulations of the pulse signal. This allows a pulse signal circulating operation of a ring oscillator to be continuously performed without the need for resetting the ring oscillator each time a pulse signal POUT is output as in conventional digitally controlled oscillation circuits.

As described above in detail, the frequency converter according to the present embodiment has a pulse phase difference encoding circuit 4 capable of repeatedly encoding the cycle of a reference signal PB input from the outside into a binary digital value DOUT based on output signals sequentially output by output terminals Q0 through Q15 of the ring oscillator 2 and a digitally controlled oscillation circuit 8 capable of repeatedly outputting a pulse signal POUT having a predetermined pulse width in a cycle in accordance with control data CD input from the outside based on output signals sequentially output by the output terminals Q0 through Q15 of the ring oscillator 2, the ring oscillator 2 being shared between the pulse phase difference encoding circuit 4 and the digitally controlled oscillation circuit 8.

As a result, the time resolution of the binary digital value DOUT obtained by the pulse phase difference encoding circuit 4 and the pulse signal POUT output by the digitally controlled oscillation circuit 8 becomes a constant time delay (2·Td) determined by the inversion time Td of inverting circuits between the output terminals Q0 through Q15 of the ring oscillator 2. For example, if the binary digital value DOUT obtained by the pulse phase difference encoding circuit 4 is input as it is to the digitally controlled oscillation circuit 8 as the control data CD, the pulse signal POUT can be output from the digitally controlled oscillation circuit 8 in completely the same cycle as that of the reference signal PB which is encoded by the pulse phase difference encoding circuit 4 into the binary digital value DOUT.

Therefore, by operating the arithmetic circuit 6 as a multiplier circuit for multiplying the binary digital value DOUT obtained by the pulse phase difference encoding circuit 4 by a predetermined value, this device can be used as an extremely accurate frequency divider. Conversely, if it is operated as a dividing circuit for dividing the binary digital value DOUT obtained by the pulse phase difference encoding circuit 4 by a predetermined value, this device can be used as an extremely accurate frequency multiplier.

The configuration of the device can be simplified to achieve a compact size because the single oscillator 2 is shared between the circuits 4 and 8 without the need for providing the pulse phase difference encoding circuit 4 and the digitally controlled oscillation circuit 8 with delay circuits to be exclusively used by them as in the prior art.

Figure 9:
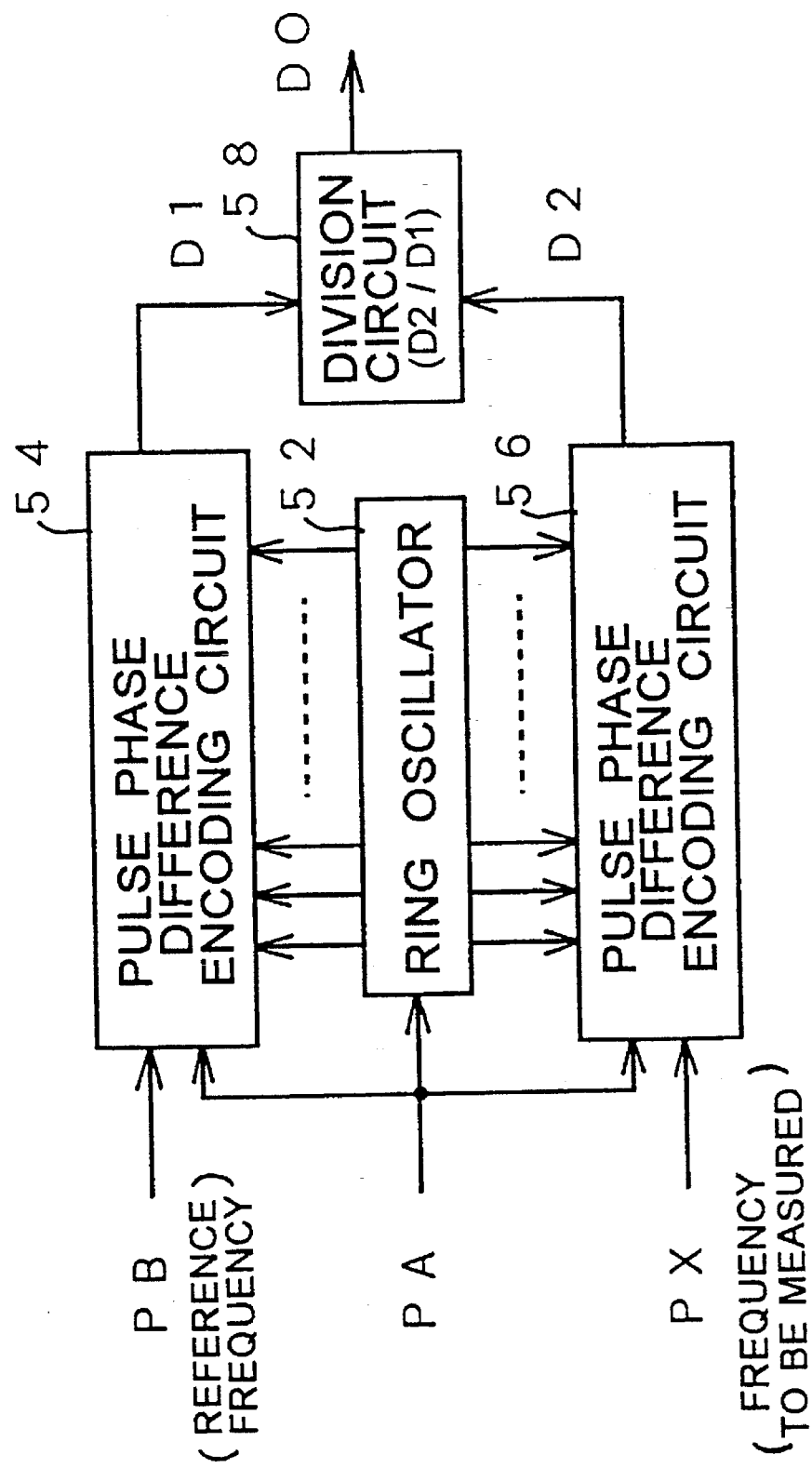
FIG. 9 is a block diagram showing a configuration of a frequency measurement device utilizing two pulse phase difference encoding circuits.
Figure 10A:
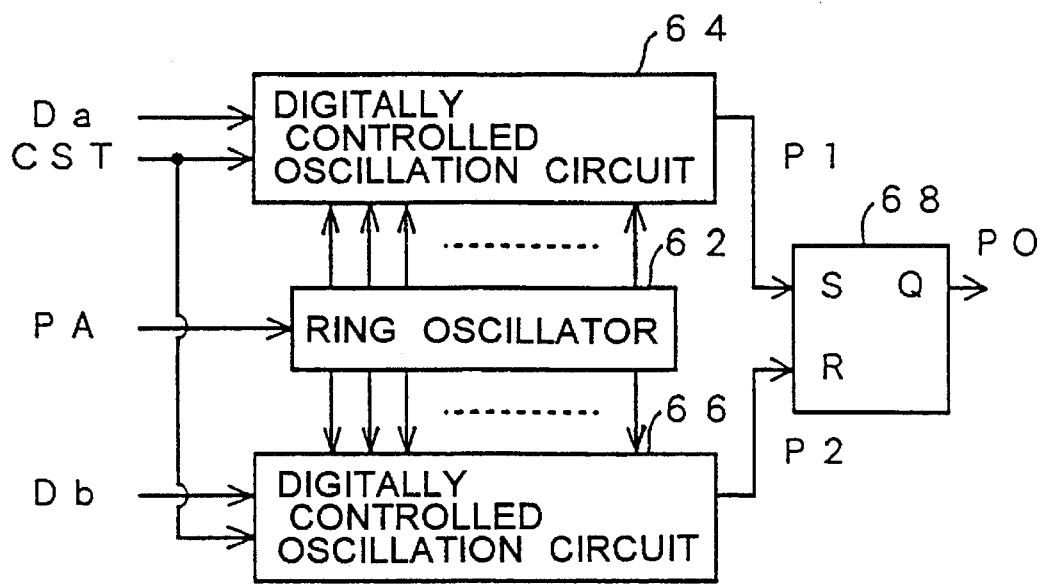
FIG. 10(a) is a block diagram showing a configuration of an oscillation device utilizing two digitally controlled oscillation circuits and FIG. 10(b) is a time chart for explaining the operation of FIG. 10(a).

Although the present embodiment has been described with reference to a frequency converter which generates a pulse signal POUT obtained by dividing or multiplying a reference signal PB using the pulse phase difference encoding circuit 4 and the digitally controlled oscillation circuit 8, the present invention can be applied to any device which concurrently uses a plurality of pulse phase difference encoding circuits and digitally controlled oscillation circuits such as PLLs utilizing the pulse phase difference encoding circuit and digitally controlled oscillation circuit as disclosed in Japanese unexamined patent publication No. H5-102801, frequency measuring devices for measuring a signal to be measured PX using two pulse phase difference encoding circuits as shown in FIG. 9, oscillators for generating a pulse signal PC having a predetermined duty ratio in a predetermined cycle in accordance with input data using two digitally controlled oscillation circuits as shown in FIG. 10(a).

In the frequency measuring device shown in FIG. 9, a reference signal PB having a known frequency is input to a pulse phase difference encoding circuit 54 to encode the cycle thereof, a signal to be measured PX whose frequency is unknown is input to a pulse phase difference encoding circuit 56 to encode the cycle thereof, and binary digital values D1 and D2 obtained by the pulse phase difference encoding circuits 54 and 56 are input to a divider circuit 58 to obtain the ratio of the cycle (D2) of the signal to be measured PX to the cycle (D1) of the reference signal PB (D0=D2/D1) to thereby measure the cycle, i.e., frequency, of the signal to be measured PX. The pulse phase difference encoding circuits 54 and 56 have the same configuration as that of the pulse phase difference encoding circuit 4 in the above-described embodiment and share a ring oscillator 52 having the same configuration as that of the ring oscillator 2 in the above-described embodiment. Therefore, the pulse phase difference encoding circuits 54 and 56 have completely the same time resolution and are capable of measuring the cycle (frequency) of the signal to be measured PX with high accuracy.

Further, the oscillation device shown in FIG. 10(a) comprises a ring oscillator 62 having the same configuration as that of the ring oscillator 2 in the above-described embodiment, two digitally controlled oscillation circuits 64 and 66 which have the same configuration as that of the digitally controlled oscillation circuit 8 in the above-described embodiment and which share the ring oscillator 62 in operation, and an RS flip-flop 68 having a set terminal S to which a pulse signal P1 from the digitally controlled oscillation circuit 64 is input and a reset terminal R to which a pulse signal P2 from the other digitally controlled oscillation circuit 66 is input.

This oscillation device is used in accordance a procedure wherein arbitrary digital data for activation is input to the digitally controlled oscillation circuits 64 and 66 as control data Da and Db, respectively, with a reset signal CST input concurrently to activate the digitally controlled oscillation circuits 64 and 66 concurrently; thereafter, the control data Da representing the cycle (frequency) of the pulse signal PO to be output by the RS flip-flop 68 is input to the digitally controlled oscillation circuit 64; the control data Db obtained by multiplying the control data Da by K (K is any value between 1 and 2) is input to the digitally controlled oscillation circuit 66 during the period until the first pulse signal P1 is output; and, after the first pulse signal P1 is output, the control data Db which is identical to the control data Da is input to the circuit 66.

Figure 10B:
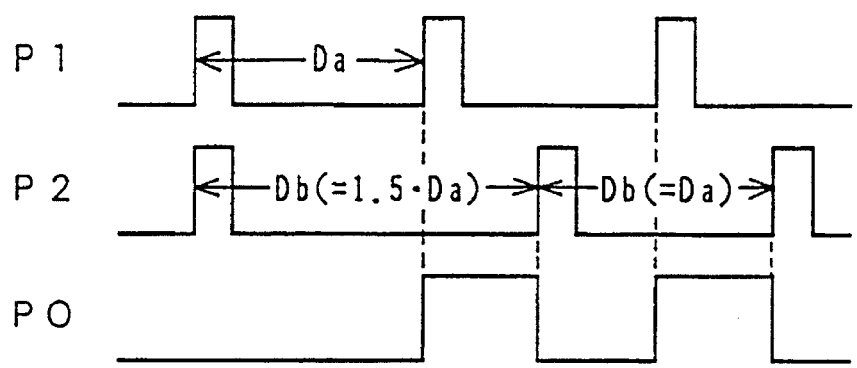

When the device is used in such a way, as shown in FIG. 10(b), the digitally controlled oscillation circuit 64 sequentially outputs the pulse signal P1 in a constant cycle in accordance with the control data Da after being activated; the other digitally controlled oscillator 66 sequentially outputs the pulse signal P2 which has the same cycle as that of the pulse signal P1 and whose phase is shifted from the cycle by (K−1); and the RS flip-flop 68 outputs the pulse signal PO having a duty ratio corresponding to the deviation between the phases of the pulse signal P1 and the pulse signal P2 (the duty ratio is 50% if K is 1.5). Therefore, the oscillation device shown in FIG. 10(a) can output a pulse signal PO having a predetermined duty ratio in a predetermined cycle depending on the values of the first control data Da and Db which are input after activation.

In this oscillation device, since the digitally controlled oscillation circuits 64 and 66 gain share the ring oscillator 62, they have completely the same time resolution, making it possible to accurately control the cycle and duty ratio of the pulse signal PO output by the RS flip-flop 68.

While a specific illustrated embodiment have been shown and described, it will be appreciated by those skilled in the art that various modifications, changes and additions can be made to the invention without departing from the spirit and scope thereof as set forth in the following claims.

What is claimed is:

1. A pulse generator for generating a pulse based on a first pulse train including first piece of information representing a phase difference or digital value and for generating a pulse based on a second pulse train including second piece of information representing a phase difference or digital value comprising:

a delay circuit which is constituted by a plurality of interconnected delay elements, to which an input signal is input at any connecting point of said delay element and which sequentially outputs a plurality of delayed signals obtained by delaying said input signal by delay periods determined by the numbers of said delay elements connected from a plurality of predetermined connecting points of said delay elements;

a first pulse output circuit to which the first pulse train is input, which outputs first position data representing the connecting position of particular one of said delay element of said delay circuit from the first piece of information in said first pulse train and which generates a first output pulse in accordance with the first position data; and a second pulse output circuit to which the second pulse train is input, which outputs second position data representing the connecting position of particular one of said delay element of said delay circuit from the second piece of information in said second pulse train and which generates a second output pulse in accordance with the second position data, said first and second pulse output circuits sharing said delay circuit in generating said respective pulses.

2. The pulse generator according to claim 1, wherein:

said first piece of information in said first pulse train is a first phase difference between a pulse at a particular point in time and a pulse at another point in time in said first pulse train;

said first pulse output circuit is constituted by a digital data encoding circuit to which said first pulse train is input, which generates first position data representing the connecting position of the delay element which issued said delayed signal when the pulse at said particular point in time in said first pulse train was input and the delay element which issued said delayed signal when the pulse at said another point in time was input and which generates first digital data constituted by a pulse indicating said first phase difference in said first pulse train from the difference between said two connecting positions in said position data;

said second pulse train is any one of said first digital data output by an arithmetic circuit in said first digital data encoding circuit, said first digital data multiplied by a predetermined value, and said first digital data divided by a predetermined value; and said second pulse output circuit is constituted by a pulse train output circuit to which said second pulse train is input, which detects said second position data from said second pulse train and which sequentially outputs a pulse when the delay element at the connecting position corresponding to said second position data issues said delayed signal among the delayed signals sequentially output by said delay circuit.

3. The pulse generator according to claim 1, wherein:

said first piece of information in said first pulse train is a first phase difference between a pulse at a particular point in time and a pulse at another point in time in said first pulse train;

said first pulse output circuit is constituted by a digital data encoding circuit to which said first pulse train is input, which encodes said first phase difference in said first pulse train into first digital data and which outputs said first digital data as said first output pulse, said digital data encoding circuit comprising a connecting position data generation circuit which detects the latest delayed signal output by said delay circuit when the pulse at said particular point in time in said first pulse train is input, generates first connecting position data representing the connecting position of the delay element which issued said latest delayed signal in response to the input of the pulse at said particular point in time within said delay circuit, detects the latest delayed signal output by said delay circuit when the pulse at said another point in time in said first pulse train is input and generates second connecting position data representing the connecting position of the delay element which issued said latest delayed signal in response to the input of the pulse at said another point in time within said delay circuit and an arithmetic circuit which calculates the positional difference between said first connecting position data and said second connecting position data generated by said connecting position data generating circuit and outputs said calculated positional difference as said first digital data representing said first phase difference in said first pulse train, said first position data comprising said first connecting position data and said second connecting position data;

said second pulse train is any one of said first digital data output by said arithmetic circuit in said first digital data encoding circuit, said first digital data multiplied by a predetermined value, and said first digital data divided by a predetermined value; and said second pulse output circuit is constituted by a digitally controlled pulse generation circuit to which said second pulse train is input and which outputs a pulse at an interval corresponding to said second pulse train as said second output pulse, said digitally controlled pulse generation circuit comprising a signal selection circuit which detects said second position data from said second pulse train and selects a second delayed signal output by the delay element at the connecting position corresponding to said second position data from among the delayed signals sequentially output by said delay circuit and a pulse train output circuit which sequentially outputs a pulse when said second delayed signal is selected by said signal selection circuit.

4. The pulse generator according to claim 2, wherein said delay circuit is constituted by a pulse circulating circuit which includes a first delay element connected in the first position and a last delay element connected in the last position, in which said last delay element is connected to said first delay element and which circulates said input signal through said plurality of interconnected delay elements; the output of said delayed signals is started in response to the input of an input signal at any connecting point of said delay elements; and said plurality of delayed signals are the result of delaying said input signal by delay periods determined by the numbers of said delay elements interconnected.

5. The pulse generator according to claim 4, wherein said connecting position data generation circuit comprises a first counting circuit which counts the number of the circulations of said input signal within said pulse circulating circuit and outputs a first count value and a data combining circuit which combines said first count value with the first and second connecting position data generated by said connecting position data generation circuit in said digital data encoding circuit and outputs the first and second connecting position data after such combination and wherein first and second connecting position data after said combination as said first and second connecting position data input to said arithmetic circuit.

6. The pulse generator according to claim 3, wherein said signal selection circuit in said digitally controlled pulse generation circuit comprises a second counting circuit which counts the number of the circulations of said pulse signal within said pulse circulating circuit and outputs a detection signal indicating when said count value reaches a value corresponding to the count value of the circulations to be made in said second pulse train and a counting control circuit which initializes the count value in said second counting circuit to resume the counting operation when said detection signal is output by said second counting circuit.

7. The pulse generator according to claim 3, wherein said signal selection circuit in said digitally controlled pulse generation circuit comprises a position data output portion to which said second pulse train is input, initially outputs said second pulse train as said second position data, updates the previously output second position data by adding the currently input second pulse train thereto and outputs the result as updated second position data and a delayed signal selecting portion which selects the second delayed signal output by the delay element at the connecting position corresponding to said second position data from among the delayed signals sequentially output by said delay circuit.

8. The pulse generator according to claim 1, wherein:

said first pulse train has a first phase difference between a pulse at a particular point in time and a pulse at another point in time, said first piece of information in said first pulse train being said first phase difference, and said second pulse train has a second phase difference between a pulse at a particular point in time and a pulse at another point in time, said second piece of information in said second pulse train being said second phase difference;

said first pulse output circuit is constituted by a first digital data encoding circuit to which said first pulse train is input, which generates first position data representing the connecting position of the delay element which issued said delayed signal when the pulse at said particular point in time in said first pulse train was input and the delay element which issued said delayed signal when the pulse at said another point in time was input and which generates first digital data constituted by a pulse indicating said first phase difference in said first pulse train from the difference between said two connecting positions in said position data; and said second pulse output circuit is constituted by a second digital data encoding circuit to which said second pulse train is input, which generates second position data representing the connecting position of the delay element which issued said delayed signal when the pulse at said particular point in time in said second pulse train was input and the delay element which issued said delayed signal when the pulse at said another point in time was input and which generates second digital data constituted by a pulse indicating said second phase difference in said second pulse train from the difference between said two connecting positions in said position data.

9. The pulse generator according to claim 1, wherein:

said first pulse train has a first phase difference between a pulse at a particular point in time and a pulse at another point in time, said first piece of information in said first pulse train being said first phase difference, and said second pulse train has a second phase difference between a pulse at a particular point in time and a pulse at another point in time, said second piece of information in said second pulse train being said second phase difference;

said first pulse output circuit is constituted by a first digital data encoding circuit to which said first pulse train is input, which encodes said first phase difference in said first pulse train into first digital data and which outputs said first digital data as said first output pulse, said first digital data encoding circuit comprising a first connecting position data generation circuit which detects the latest delayed signal output by said delay circuit when the pulse at said particular point in time in said first pulse train is input, generates first connecting position data representing the connecting position of the delay element which issued said latest delayed signal in response to the input of the pulse at said particular point in time within said delay circuit, detects the latest delayed signal output by said delay circuit when the pulse at said another point in time in said first pulse train is input and generates second connecting position data representing the connecting position of the delay element which issued said latest delayed signal in response to the input of the pulse at said another point in time within said delay circuit and a first arithmetic circuit which calculates the positional difference between said first connecting position data and said second connecting position data generated by said first connecting position data generating circuit and outputs said calculated positional difference as said first digital data representing said first phase difference in said first pulse train, said first position data comprising said first connecting position data and said second connecting position data;

said second pulse output circuit is constituted by a second digital data encoding circuit to which said second pulse train is input, which encodes said second phase difference in said second pulse train into second digital data and which outputs said second digital data as said second output pulse, said second digital data encoding circuit comprising a second connecting position data generation circuit which detects the latest delayed signal output by said delay circuit when the pulse at said particular point in time in said second pulse train is input, generates third connecting position data representing the connecting position of the delay element which issued said latest delayed signal in response to the input of the pulse at said particular point in time within said delay circuit, detects the latest delayed signal output by said delay circuit when the pulse at said another point in time in said second pulse train is input and generates fourth connecting position data representing the connecting position of the delay element which issued said latest delayed signal in response to the input of the pulse at said another point in time within said delay circuit and a second arithmetic circuit which calculates the positional difference between said third connecting position data and said fourth connecting position data generated by said second connecting position data generating circuit and outputs said calculated positional difference as said second digital data representing said second phase difference in said second pulse train, said second position data comprising said third connecting position data and said fourth connecting position data;

said second pulse train is any one of said first digital data output by said arithmetic circuit in said first digital data encoding circuit, said first digital data multiplied by a predetermined value, and said first digital data divided by a predetermined value; and said second pulse output circuit is constituted by a digitally controlled pulse generation circuit to which said second pulse train is input and which outputs a pulse at an interval corresponding to said second pulse train as said second output pulse, said digitally controlled pulse generation circuit comprising a signal selection circuit which detects said second position data from said second pulse train and selects a second delayed signal output by the delay element at the connecting position corresponding to said second position data among the delayed signals sequentially output by said delay circuit and a pulse train output circuit which sequentially outputs a pulse when said second delayed signal is selected by said signal selection circuit.

10. The pulse generator according to claim 8, wherein said delay circuit is constituted by a pulse circulating circuit which includes a first delay element connected in the first position and a last delay element connected in the last position, in which said last delay element is connected to said first delay element and which circulates said input signal through said plurality of interconnected delay elements; the output of said delayed signals is started in response to the input of an input signal at any connecting point of said delay elements; and said plurality of delayed signals are the result of delaying said input signal by delay periods determined by the numbers of said delay elements interconnected.

11. The pulse generator according to claim 9, wherein:

said first connecting position data generation circuit comprises a first counting circuit which counts the number of the circulations of said input signal within said pulse circulating circuit and outputs a first count value and a first data combining circuit which combines said first count value with the first and second connecting position data generated by said first connecting position data generation circuit in said first digital data encoding circuit and outputs the results;

said second connecting position data generation circuit comprises a second counting circuit which counts the number of the circulations of said input signal within said pulse circulating circuit and outputs a second count value and a second data combining circuit which combines said second count value with the third and fourth connecting position data generated by said second connecting position data generation circuit in said second digital data encoding circuit and outputs the results; and said combined data is output as said third and fourth connecting position data input to said second arithmetic circuit.

12. The pulse generator according to claim 8, comprising a dividing circuit for calculating the ratio between said first digital data from said first digital data encoding circuit and said second digital data from said second digital data encoding circuit.

13. The pulse generator according to claim 1, wherein:

said first pulse train is first digital data including said first piece of information, and said second pulse train is second digital data including said second piece of information;

said first pulse output circuit is constituted by a first digitally controlled pulse generation circuit to which said first pulse train is input, which detects said first position data from said first pulse train and which sequentially generates a pulse when the delay element at the connecting position corresponding to said first position data issues said delayed signal among the delayed signals sequentially output by said delay circuit; and said second pulse output circuit is constituted by a second digitally controlled pulse generation circuit to which said second pulse train is input, which detects said second position data from said second pulse train and which sequentially generates a pulse when the delay element at the connecting position corresponding to said second position data issues said delayed signal among the delayed signals sequentially output by said delay circuit.

14. The pulse generator according to claim 1, wherein:

said first pulse train is first digital data including said first piece of information, and said second pulse train is second digital data including said second piece of information;

said first pulse output circuit is constituted by a first digitally controlled pulse generation circuit which outputs a pulse at an interval corresponding to said first piece of information in said first digital data as said first output pulse, said first digitally controlled pulse generation circuit comprising a first signal selection circuit to which said first digital data is input, which detects said first position data from said first digital data and which selects a first delayed signal output by the delay element at the connecting position corresponding to said first position data from among the delayed signals sequentially output by said delay circuit and a first pulse train output circuit which sequentially outputs a pulse when said first delayed signal is selected by said first signal selection circuit; and said second pulse output circuit is constituted by a second digitally controlled pulse generation circuit which outputs a pulse at an interval corresponding to said second piece of information in said second digital data as said second output pulse, said second digitally controlled pulse generation circuit comprising a second signal selection circuit to which said second digital data is input, which detects said second position data from said second digital data and which selects a second delayed signal output by the delay element at the connecting position corresponding to said second position data from among the delayed signals sequentially output by said delay circuit and a second pulse train output circuit which sequentially outputs a pulse when said second delayed signal is selected by said second signal selection circuit.

15. The pulse generator according to claim 13, wherein said delay circuit is constituted by a pulse circulating circuit which includes a first delay element connected in the first position and a last delay element connected in the last position, in which said last delay element is connected to said first delay element and which circulates said input signal through said plurality of interconnected delay elements; the output of said delayed signals is started in response to the input of an input signal at any connecting point of said delay elements; and said plurality of delayed signals are the result of delaying said input signal by delay periods determined by the numbers of said delay elements interconnected.

16. The pulse generator according to claim 14, wherein:

said first signal selection circuit in said first digitally controlled pulse generation circuit comprises a first counting circuit which counts the number of the circulations of said pulse signal within said pulse circulating circuit and outputs a detection signal indicating when said count value reaches a value corresponding to the count value of the circulations to be made in said first digital data and a first counting control circuit which initializes the count value in said first counting circuit to resume the counting operation when said detection signal is output by said first counting circuit; and said second signal selection circuit in said second digitally controlled pulse generation circuit comprises a second counting circuit which counts the number of the circulations of said pulse signal within said pulse circulating circuit and outputs a detection signal indicating when said count value reaches a value corresponding to the count value of the circulations to be made in said second digital data and a second counting control circuit which initializes the count value in said second counting circuit to resume the counting operation when said detection signal is output by said second counting circuit.

17. The pulse generator according to claim 13, wherein:

said first signal selection circuit comprises a first position data output portion to which said first digital data is input, initially outputs said first digital data as said first position data, updates the previously output first position data by adding the currently input first digital data thereto and outputs the result as updated first position data and a first delayed signal selecting portion which selects the first delayed signal output by the delay element at the connecting position corresponding to said first position data from among the delayed signals sequentially output by said delay circuit; and said second signal selection circuit comprises a second position data output portion to which said second digital data is input, initially outputs said second digital data as said second position data, updates the previously output second position data by adding the currently input second digital data thereto and outputs the result as updated second position data and a second delayed signal selecting portion which selects the second delayed signal output by the delay element at the connecting position corresponding to said second position data from among the delayed signals sequentially output by said delay circuit.

* * * * *